US010928951B2

(12) United States Patent
Sakaue et al.

(10) Patent No.: US 10,928,951 B2
(45) Date of Patent: Feb. 23, 2021

(54) TOUCH PANEL HAVING HIGH RESISTANCE TO STATIC ELECTRICITY

(71) Applicant: JAPAN AVIATION ELECTRONICS INDUSTRY, LIMITED, Tokyo (JP)

(72) Inventors: Akitoshi Sakaue, Tokyo (JP); Hiroshi Okumura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/412,975

(22) Filed: May 15, 2019

(65) Prior Publication Data
US 2019/0369832 A1 Dec. 5, 2019

(30) Foreign Application Priority Data

May 31, 2018 (JP) .............................. JP2018-104368

(51) Int. Cl.
*G06F 3/041* (2006.01)
(52) U.S. Cl.
CPC ............. *G06F 3/04164* (2019.05); *G06F 2203/04107* (2013.01)
(58) Field of Classification Search
CPC ....... G06F 3/04164; G06F 2203/04107; G06F 3/0446; G06F 2203/04112; G06F 3/0445;
(Continued)

(56) References Cited

U.S. PATENT DOCUMENTS 9,921,682 B2 3/2018 Sato et al.
2007/0081283 A1* 4/2007 Cheung .................. H01T 21/00
361/56

(Continued)

FOREIGN PATENT DOCUMENTS

CN 206162468 U * 5/2017 ............. G06F 3/041
CN 107329626 A 11/2017
(Continued)

OTHER PUBLICATIONS

Office Action issued in Taiwanese family member Patent Appl. No. 108117492, dated Apr. 28, 2020, along with an English translation thereof.

(Continued)

*Primary Examiner* — Temesghen Ghebretinsae
*Assistant Examiner* — Ivelisse Martinez Quiles
(74) *Attorney, Agent, or Firm* — Greenblum & Bernstein, P.L.C.

(57) ABSTRACT

A touch panel includes two ground wires. One end portion (an end portion X1) of one of the two ground wires and one end portion (an end portion Y1) of the other of the two ground wires form a gap. When the touch panel is viewed from front, the following condition as an example is satisfied: a line segment Z1 intersects at least one of the two ground wires. The line segment Z1 is a line segment which connects any one point P1 on a first line segment and any one point Q1 on a second line segment, the first line segment connecting a site of the end portion X1 and a site of the end portion Y1 which are located on two sides of an outer gate of the gap, the second line segment connecting a site of the end portion X1 and a site of the end portion Y1.

6 Claims, 14 Drawing Sheets

(58) Field of Classification Search
CPC ............... G06F 3/0412; G06F 3/0418; G06F 2203/04103; H05K 1/0259
See application file for complete search history.

(56) References Cited

U.S. PATENT DOCUMENTS

| | | | |
|---|---|---|---|
| 2012/0235691 A1* | 9/2012 | Ho | G06F 3/044 324/658 |
| 2013/0201122 A1* | 8/2013 | Kurashima | G06F 3/0414 345/173 |
| 2014/0138141 A1* | 5/2014 | Li | H05K 1/0259 174/261 |
| 2015/0060256 A1 | 3/2015 | Kim et al. | |
| 2015/0317011 A1* | 11/2015 | Chen | G06F 3/044 345/174 |
| 2016/0149401 A1* | 5/2016 | Chen | H02H 9/04 361/56 |
| 2017/0090652 A1* | 3/2017 | Sato | G06F 3/0416 |
| 2017/0104016 A1* | 4/2017 | Wang | G02F 1/136204 |
| 2018/0059834 A1* | 3/2018 | Wu | G06F 3/047 |
| 2018/0300007 A1* | 10/2018 | Xu | G06F 3/03542 |
| 2019/0377450 A1* | 12/2019 | Xu | G06F 3/0445 |

FOREIGN PATENT DOCUMENTS

| | | |
|---|---|---|
| CN | 207008581 U | 2/2018 |
| JP | 5957132 B1 | 6/2016 |
| KR | 10-2015-0025638 A | 3/2015 |

OTHER PUBLICATIONS

Office Action issued in Republic of Korea Counterpart Patent Appl. No. 10-2019-0058684, dated Sep. 28, 2020, along with an English translation thereof.

* cited by examiner

TOUCH PANEL HAVING HIGH RESISTANCE TO STATIC ELECTRICITY

TECHNICAL FIELD

The present invention relates to a touch panel and, more particularly, to a touch panel excellent in resistance to static electricity.

BACKGROUND ART

FIGS. 1A, 1B, 2, and 3 show a configuration of a capacitance type touch panel 100 disclosed in Patent Literature 1 (Japanese Registered Patent No. 5957132) as a prior art touch panel.

In the touch panel 100 attached to a housing 200 made of resin, a first conductor layer 12, an insulating layer 13, a second conductor layer 14, and a protective film 15 are stacked in this order on a transparent substrate 11 in the shape of a rectangular flat board (see FIG. 1B). A cover 17 in the shape of a rectangular flat board is pasted to an upper portion of the protective film 15 with an optical clear adhesive (OCA) 16. A material for the transparent substrate 11 is, for example, polyethylene terephthalate (PET) or polycarbonate (PC). A material for the cover 17 is, for example, PC. A material for each of the insulating layer 13 and the protective film 15 is, for example, acrylic resin or epoxy resin. The cover 17 and the optical clear adhesive 16 are not shown in FIG. 1A.

The touch panel 100 includes at least a first sensor circuit part 101, a second sensor circuit part 102, two first ground wires 51a and 51b, two second ground wires 52a and 52b, and one shielding wire 60. The first sensor circuit part 101 includes first sensor electrode rows 21 and first frame wires 41. The second sensor circuit part 102 includes second sensor electrode columns 25 and second frame wires 42. Some of the first sensor electrode rows 21 and some of the second sensor electrode columns 25 are shown in FIG. 1A.

The two first ground wires 51a and 51b each have a strip-like shape which is bent at two spots (that is, the shape of a staple). The two second ground wires 52a and 52b each have a strip-like shape which is bent at two spots (that is, the shape of a staple). When the touch panel 100 is viewed from front (that is, when the touch panel 100 is viewed in a normal direction of the cover 17), the first sensor circuit part 101 is sandwiched between the two first ground wires 51a and 51b, and the second sensor circuit part 102 is sandwiched between the two second ground wires 52a and 52b. When the touch panel 100 is viewed from front, the first sensor electrode rows 21 and the second sensor electrode columns 25 are located in a sensor region 30 which is a central region of the touch panel 100. The first sensor electrode rows 21, the first frame wires 41, the second frame wires 42, and the two first ground wires 51a and 51b are formed at the first conductor layer 12. The second sensor electrode columns 25, the two second ground wires 52a and 52b, and the shielding wire 60 are formed at the second conductor layer 14. The second conductor layer 14 is insulated from the first conductor layer 12 with the insulating layer 13.

Details of a structure of the touch panel 100 will be described below. For simplicity of description, "one of the two first ground wires 51a and 51b" may also be simply referred to as "the first ground wire 51a", and "the other of the two first ground wires 51a and 51b" may also be simply referred to as "the first ground wire 51b", Similarly, "one of the two second ground wires 52a and 52b" may also be simply referred to as "the second ground wire 2a", and "the other of the two second ground wires 52a and 52b" may also be simply referred to as "the second ground wire 52b".

<Second Conductor Layer 14—FIG. 3>

Each second sensor electrode column 25 includes second island electrodes 26 and second coupling portions 27 which are arrayed in a Y direction parallel to one sides (short sides) of the touch panel 100. Each second coupling portion 27 couples two adjacent second island electrodes 26. The second sensor electrode columns 25 are apposed in an X direction parallel to the other sides (long sides) of the touch panel 100. An outer shape of each second island electrode 26 is a diamond shape.

The two second ground wires 52a and 52b are located in a peripheral portion of the touch panel 100 and are across the sensor region 30, where the plurality of second sensor electrode columns 25 are located, from each other with a large gap between the second ground wires 52a and 52b and the sensor region 30. At a central portion of an upper side of the touch panel 100, one end portion of the second ground wire 52a and one end portion of the second ground wire 52b face each other in an extension direction of the two end portions with a small second gap 54 therebetween. At a central portion of a lower side of the touch panel 100, the other end portion of the second ground wire 52a and the other end portion of the second ground wire 52b face each other in an extension direction of the two end portions with a large gap therebetween.

The shielding wire 60 in the shape of a horseshoe is located in a large gap between the sensor region 30, where the second sensor electrode columns 25 are located, and a region where the two second ground wires 52a and 52b are located, as shown in FIG. 3. The two second ground wires 52a and 52b are each connected to the shielding wire 60. The shielding wire 60 is hatched in FIGS. 1A and 3.

<First Conductor Layer 12—FIG. 2>

Each first sensor electrode row 21 includes first island electrodes 22 and first coupling portions 23 which are arrayed in the X direction parallel to the long sides of the touch panel 100. Each first coupling portion 23 couples two adjacent first island electrodes 22. The first sensor electrode rows 21 are apposed in the Y direction parallel to the short sides of the touch panel 100. An outer shape of each first island electrode 22 is a diamond shape. When the touch panel 100 is viewed from front, the first sensor electrode rows 21 and the second sensor electrode columns 25 intersect each other in a state where the first island electrodes 22 and the second island electrodes 26 do not overlap and the first coupling portions 23 and the second coupling portions 27 intersect (see FIG. 1A).

The two first ground wires 51a and 51b are located in the peripheral portion of the touch panel 100 and are across the sensor region 30, where the first sensor electrode rows 21 are located, from each other with a large gap between the first ground wires 51a and 51b and the sensor region 30. At the central portion of the upper side of the touch panel 100, one end portion of the first ground wire 51a and one end portion of the first ground wire 51b face each other in an extension direction of the two end portions with a small first gap 53 therebetween. At the central portion of the lower side of the touch panel 100, the other end portion of the first ground wire 51a and the other end portion of the first ground wire 51b face each other in an extension direction of the two end portions with a large gap therebetween.

The first ground wire 51a has the same shape as the second ground wire 52a and is located immediately below the second ground wire 52a in a state where the insulating layer 13 intervenes between the first ground wire 51a and the second ground wire 52a. Similarly, the first ground wire 51b has the same shape as the second ground wire 52b and is located immediately below the second ground wire 52b in a state where the insulating layer 13 intervenes between the first ground wire 51b and the second ground wire 52b.

The first frame wires 41 and the second frame wires 42 are located in a large gap between the sensor region 30, where the first sensor electrode rows 21 are located, and a region where the two first ground wires 51a and 51b are located, as shown in FIG. 2. The first frame wires 41 are each connected to a corresponding one of the first sensor electrode rows 21. In the present example, one end of each of the first frame wires 41 is connected to a corresponding one of one ends (left ends in the X direction in FIG. 2) of the first sensor electrode rows 21. Similarly, one end of each of the first frame wires 41 is connected to a corresponding one of other ends (right ends in the X direction in FIG. 2) of the first sensor electrode rows 21. The second frame wires 42 are each connected to a corresponding one of the second sensor electrode columns 25. Additionally, one end of one of the second frame wires 42 is connected to a corresponding one of one ends (lower ends in the Y direction in FIG. 3) of the second sensor electrode columns 25 through a via hole (not shown) formed in the insulating layer 13.

Only two outermost ones in each bundle of the first frame wires 41 are shown in FIGS. 1A and 2(a), and the remaining first frame wires 41 are not shown. Similarly, only two outermost ones in a bundle of the second frame wires 42 are shown in FIGS. 1A and 2(a), and the remaining second frame wires 42 are not shown.

The other ends of the first frame wires 41 and the other ends of the second frame wires 42 are led out of the touch panel 100 through the large gap between the other end portion of the first ground wire 51a and the other end portion of the first ground wire 51b.

The shielding wire 60 is located immediately above frame wires (specifically, the first frame wires 41 and the second frame wires 42) in a state where the insulating layer 13 intervenes between the shielding wire 60 and the frame wires. That is, the first frame wires 41 and the second frame wires 42 are covered with the shielding wire 60 (see FIG. 1B).

In the present example, the touch panel 100 further includes two third ground wires 43. One of the two third ground wires 43 separates the bundle of the second frame wires 42 from the bundle of the first frame wires 41 which is connected to the one ends of the first sensor electrode rows 21. The other of the two third ground wires 43 separates the bundle of the second frame wires 42 from the bundle of the first frame wires 41 which is connected to the other ends of the first sensor electrode rows 21 (see FIGS. 1A and 2).

The two first ground wires 51a and 51b, the two second ground wires 52a and 52b, the first frame wires 41, the second frame wires 42, and the two third ground wires 43 are each connected to an external circuit board (not shown) at a central portion of a lower side of the transparent substrate 11.

<Printed Wiring>

In the above-described configuration, the first sensor electrode rows 21 and the second sensor electrode columns 25 each have a planar mesh structure formed of thin lines, as shown in FIGS. 2 and 3, and are formed by printing. Similarly, the two first ground wires 51a and 51b, the two second ground wires 52a and 52b, and the two third ground wires 43 also each have a planar mesh structure formed of thin lines in terms of printability. Although the first frame wires 41 and the second frame wires 42 each have a single-line structure in the present example, the frame wire may has a planar mesh structure.

The first and second conductor layers 12 and 14 are formed by gravure offset printing using a conductive ink containing conductive particles of, for example, silver. Respective mesh opening ratios of the two first ground wires 51a and 51b, the two second ground wires 52a and 52b, and the two third ground wires 43 are lower than a mesh opening ratio of the shielding wire 60. More specifically, a lower opening ratio is achieved by reducing distances between lines (widths of spaces), that is, reducing a mesh interval while keeping a line width constant, as shown in FIG. 3.

<Functions of Ground Wires and Shielding Wire>

In the touch panel 100, the two first ground wires 51a and 51b and the two second ground wires 52a and 52b contribute to electro magnetic compatibility (EMC). That is, the two first ground wires 51a and 51b and the two second ground wires 52a and 52b have a function of protecting the frame wires (specifically, the first frame wires 41 and the second frame wires 42) by absorbing electromagnetic noise entering the touch panel 100 from a direction parallel to a surface of the cover 17 (that is, a direction orthogonal to a normal of a surface of the transparent substrate 11) to prevent a malfunction of the touch panel 100 and a function of preventing a malfunction of an external device by absorbing electromagnetic noise emitted outward from the touch panel 100 in the direction parallel to the surface of the cover 17.

Additionally, the two first ground wires 51a and 51b and the two second ground wires 52a and 52b have a function of releasing static electricity invading the touch panel 100 to an external circuit board in order to prevent the frame wires (specifically, the first frame wires 41 and the second frame wires 42) from being broken due to electro static discharge (ESD) that is generated, for example, when a user touches the touch panel 100.

The shielding wire 60 contributes to EMC. That is, the shielding wire 60 has a function of protecting the frame wires (specifically, the first frame wires 41 and the second frame wires 42) by absorbing electromagnetic noise entering the touch panel 100 from the direction perpendicular to the surface of the transparent substrate 11 to prevent a malfunction of the touch panel 100 and a function of preventing a malfunction of an external device by absorbing electromagnetic noise emitted outward from the touch panel 100 in the direction perpendicular to the surface of the transparent substrate 11.

In the touch panel 100, the two first ground wires 51a and 51b are separated by the first gap 53 in order to suppress an antenna effect which generates a noise current in a ground wire. Similarly, the two second ground wires 52a and 52b are separated by the second gap 54 in order to suppress an antenna effect which generates a noise current in a ground wire. Since static electricity may invade the touch panel 100 through the first and second gaps 53 and 54, sufficient measures are not taken against ESD in the touch panel 100.

SUMMARY OF THE INVENTION

An object of the present invention is to provide a touch panel which has good resistance to static electricity.

A touch panel according to the present invention includes a first sensor circuit part, and two first ground wires each of which has a strip-like shape. The first sensor circuit part and the two first ground wires are formed at a same layer. The first sensor circuit part is sandwiched between the two first ground wires. One end portion (here, simply referred to by the name "an end portion X1") of one of the two first ground wires and one end portion (here, simply referred to by the name "an end portion Y1") of the other of the two first ground wires form a first gap. When the touch panel is viewed from front, one of the following conditions 1) and 2) is satisfied:

1) a line segment Z1 intersects at least one of the two first ground wires, the line segment Z1 being a line segment which connects any one point P1 on a first line segment and any one point Q1 on a second line segment, the first line segment connecting a site of the end portion X1 and a site of the end portion Y1 which are located on two sides of an outer gate of the first gap, the second line segment connecting a site of the end portion X1 and a site of the end portion Y1 which are located on two sides of an inner gate of the first gap; and 2) an extension of a line segment V1 which extends into the touch panel intersects either one of the two first ground wires without intersecting the first sensor circuit part, the line segment V1 being any one line segment which connects a point J1 on a first line segment and a point K1 on a second line segment and not intersecting the two first ground wires, the first line segment connecting a site of the end portion X1 and a site of the end portion Y1 that are located on two sides of an outer gate of the first gap, the second line segment connecting a site of the end portion X1 and a site of the end portion Y1 that are located on two sides of an inner gate of the first gap.

Effects of the Invention

The touch panel according to the present invention has a structure which satisfies the above-described condition 1) or 2) and has good resistance to static electricity.

DETAILED DESCRIPTION OF THE EMBODIMENTS

Figure 1A:
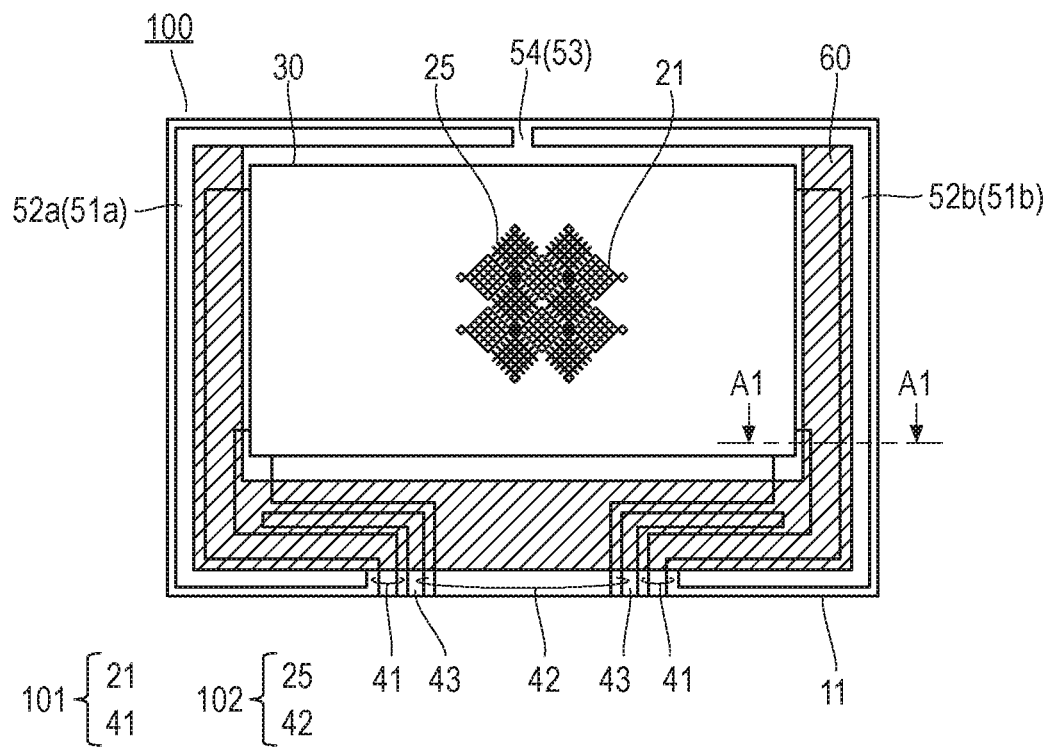
FIG. 1A is a plan view showing a conventional touch panel.
Figure 1B:
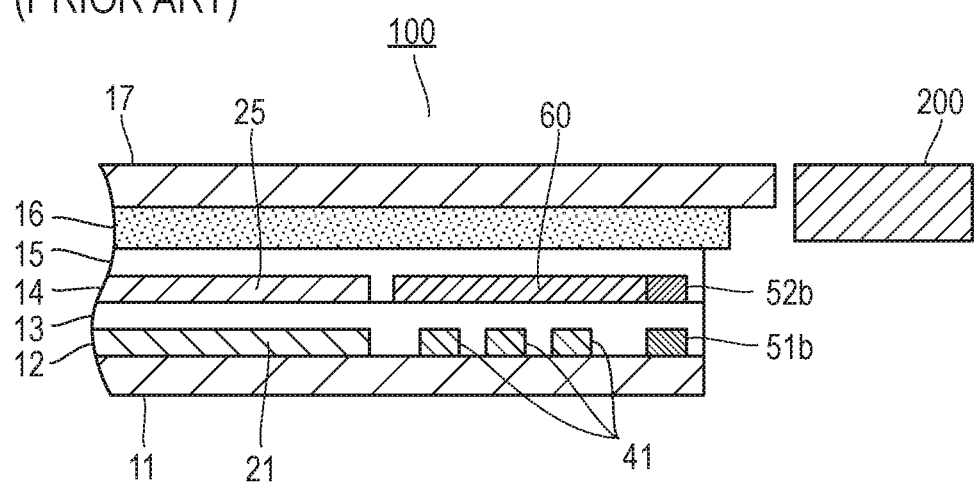
FIG. 1B is a view for explaining a cross-section configuration (A1-A1) of the touch panel shown in FIG. 1A.
Figure 2:
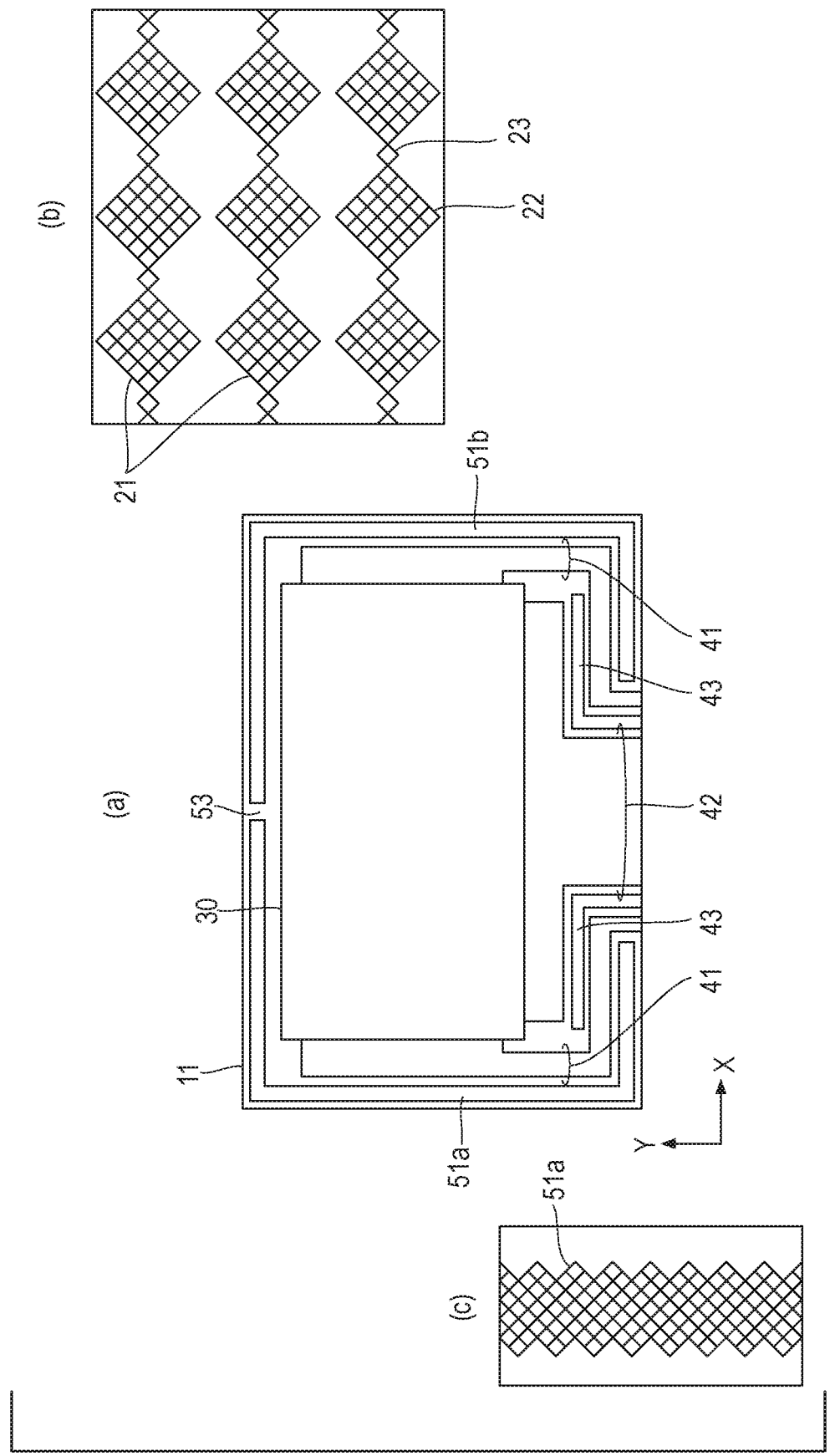
FIG. 2 is a view showing an outline of a first conductor layer of the touch panel shown in FIG. 1A, (a) is a plan view of the first conductor layer, (b) is a partial enlarged view of sensor electrode rows, and (c) is a partial enlarged view of a ground wire.
Figure 3:
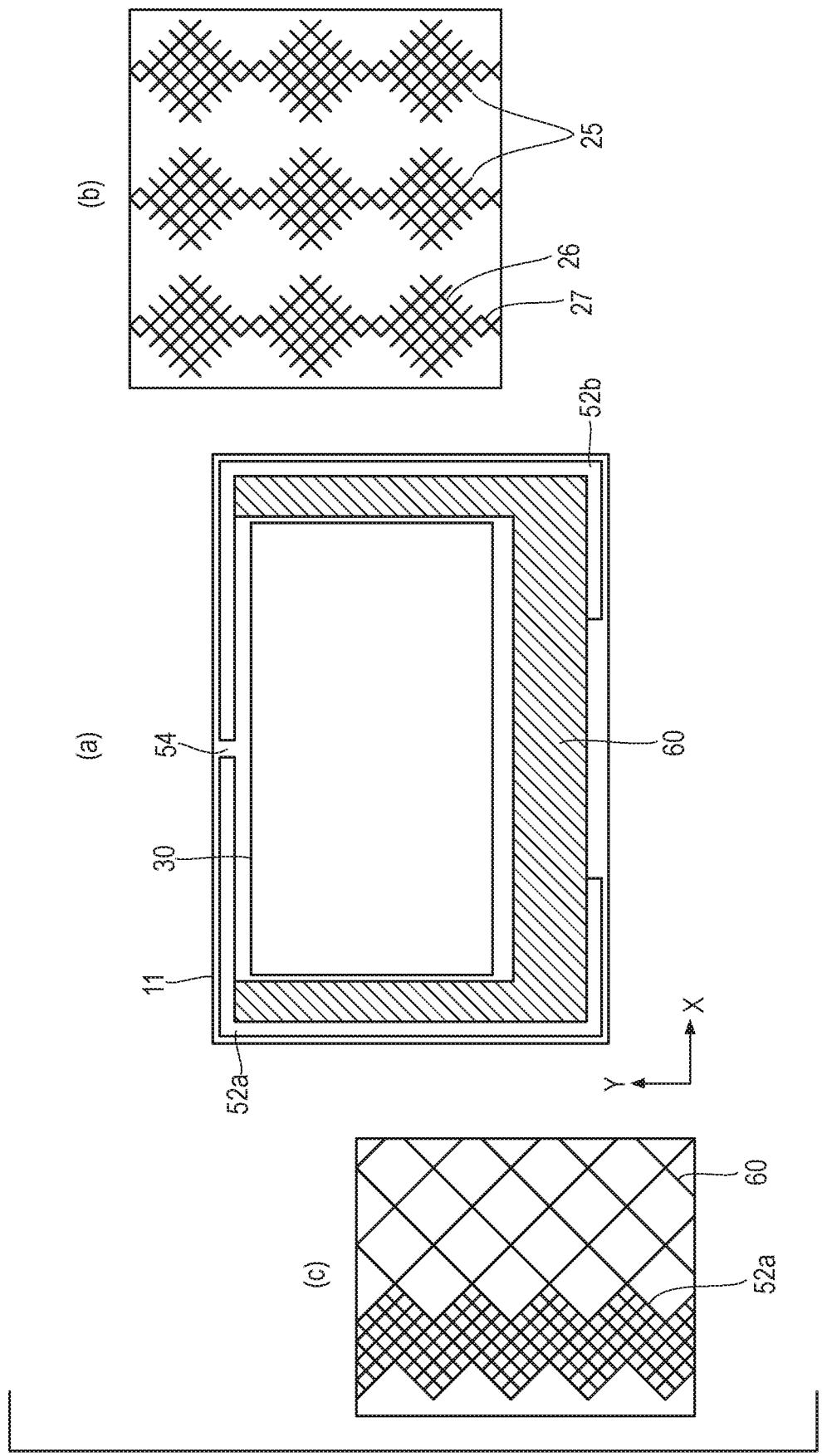
FIG. 3 is a view showing an outline of a second conductor layer of the touch panel shown in FIG. 1A, (a) is a plan view of the second conductor layer, (b) is a partial enlarged view of sensor electrode columns, and (c) is a partial enlarged view of a ground wire and a shielding wire.

A touch panel TP according to an embodiment has the same configuration as the prior art touch panel 100, except for shapes of first and second gaps (that is, configuration of one end portion of each of two first ground wires and two second ground wires). Differences between the two touch panels will be described here. As for technical matters common to the two touch panels, the above description of the touch panel 100 is incorporated herein, and a redundant description of the common matters will be omitted.

In the touch panel TP according to the embodiment, each of two first ground wires W is formed by printing and has a flat strip-like shape having a width of about several millimeters and a thickness of about 0.1 millimeters. In the touch panel TP according to the embodiment, a first sensor circuit part M and the two first ground wires W are formed at a same layer and the first sensor circuit part M is sandwiched between the two first ground wires W. In the touch panel TP according to the embodiment, a first gap G is formed by one end portion (hereinafter referred to as an end portion X1) of one of the two first ground wires W and one end portion (hereinafter referred to as an end portion Y1) of the other of the two first ground wires W, Each of "the end portion X1" and "the end portion Y1" need not be "terminal ends" and includes a terminal end and a vicinity of the terminal end.

When the touch panel TP according to the embodiment is viewed from front (that is, when the touch panel TP is viewed in a normal direction of a cover), one of the following conditions C1 and C2 is satisfied.

C1) A line segment Z1 intersects at least one of the two first ground wires W. Here, the line segment Z1 is a line segment which connects any one point P1 on a first line segment and any one point Q1 on a second line segment, the first line segment connecting a site R1 of the end portion X1 and a site S1 of the end portion Y1, the site R1 and the site S1 being located on two sides of an outer gate of the first gap G, the second line segment connecting a site T1 of the end portion X1 and a site U1 of the end portion Y1, the site T1 and the site U1 being located on two sides of an inner gate of the first gap G C2) An extension V1E of a line segment V1 intersects either one of the two first ground wires W without intersecting a first sensor circuit part M. Here, the line segment V1 is any one line segment which satisfies the condition C2p that "the line segment V1 connects a point J1 on a first line segment and a point K1 on a second line segment and does not intersect the two first ground wires W, the first line segment connecting a site R1 of the end portion X1 and a site S1 of the end portion Y1, the site R1 and the site S1 being located on two sides of an outer gate of the first gap G, the second line segment connecting a site T1 of the end portion X1 and a site U1 of the end portion Y the site T1 and the site U1 being located on two sides of an inner gate of the first gap G". The extension V1E is a half line obtained by extending the line segment V1 into the touch panel TP.

The term "outer gate" refers to an entrance to (or an exit from) the first gap G which is visible from outside the touch panel TP in a plane F where the two first ground wires W are located. Since how the Outer gate looks changes in accordance with an eye direction, an eye direction E1 is defined here as "a direction in which one can look as deep as possible into the first gap G from outside the touch panel TP". The term "visible" does not necessarily mean that "the entrance to (or the exit from) the first gap G is visually recognizable in the actual touch panel TP" but means that "the entrance to (or the exit from) the first gap G is visually recognizable in a situation where only shapes and arrangement of the two first ground wires W are considered". "The site R1 of the end portion X1 and the site S1 of the end portion Y1, the site R1 and the site S1 being located on the two sides of the outer gate" are defined as two end points of a closed line segment on a straight line H1, orthogonal to the eye direction E1 in the plane F, which does not touch the two first ground wires W except for the two end points in (a) a situation where the straight line H1 is in contact with both of the two first ground wires W near the first gap G, (b) a situation where the straight line H1 is in contact with one of the two first ground wires W and intersects the other near the first gap G, or (c) a situation where the straight line H1 intersects one of the two first ground wires W and is in contact with the other near the first gap G. The term "first line segment" refers to the closed line segment.

Similarly, the term "inner gate" refers to an exit from (or an entrance to) the first gap G which is visible from inside the touch panel TP in the plane F. Since how the inner gate looks changes in accordance with an eye direction, an eye direction E2 is defined here as "a direction in which one can look as deep as possible into the first gap G from inside the touch panel TP". The term "visible" does not necessarily mean that "the exit from (or the entrance to) the first gap G is visually recognizable in the actual touch panel TP" but means that "the exit from (or the entrance to) the first gap G is visually recognizable in a situation where only the shapes and arrangement of the two first ground wires W are considered". "The site T1 of the end portion X1 and the site U1 of the end portion Y1, the site T1 and the site U being located on the two sides of the inner gate" are defined as two end points of a closed line segment on a straight line H2, orthogonal to the eye direction E2 in the plane F, which does not touch the two first ground wires W except for the two end points in (a) a situation where the straight line H2 is in contact with both of the two first ground wires W near the first gap G, (b) a situation where the straight line H2 is in contact with one of the two first ground wires W and intersects the other near the first gap E or (c) a situation where the straight line H2 intersects one of the two first ground wires W and is in contact with the other near the first gap G. The term "second line segment" refers to the closed line segment.

As for the conditions C1 and C2, note that "although the points P1 and Q1 are "any two points" on the first line segment and the second line segment in the condition C1, the point J1 is not necessarily "any one point" on the first line segment in the condition C2 and the point K1 is not necessarily "any one point" on the second line segment in the condition C2".

When the condition C1 is satisfied, since there is a significantly low probability that an electrostatic discharge path which allows passage through the first gap without touching at least either one of the two first ground wires W is generated in actual use of the touch panel, the first gap can be said to be electrically closed. Thus, the touch panel according to the embodiment has good resistance to static electricity.

When the condition C2 is satisfied, it is highly probable that the static electricity arrives at either one of the two first ground wires W without arriving at the first sensor circuit part M, even if static electricity passes through the first gap due to ESD without touching at least either one of the two first ground wires W. Thus, the touch panel according to the embodiment has good resistance to static electricity.

When the condition C2 is satisfied, the following condition C21 is preferably satisfied.

C21) A maximum value of a first distance D1 is smaller than a minimum value of a second distance D2, the first distance D1 being a distance between the point K1 and an intersection VV of the extension V1E and an inner edge of the first ground wire W (that is, either one of the two first ground wires W) intersecting the extension V1E, the second distance D2 being a shortest distance from the point K1 to the first sensor circuit part M (for example, circuit elements such as electrodes, coupling portions, and frame wires).

When the configuration of the touch panel TP also satisfies the condition C21, the probability that static electricity passing through the first gap G due to ESD does not arrive at the first ground wire W but arrives at the first sensor circuit part M is sufficiently low.

When the condition C1 is satisfied, the first gap is, for example, non-linear. Examples of a specific shape of the first gap in this case include a crank shape, a meander shape, a triangular wave shape, a rectangular wave shape, a sinusoidal wave shape, a saw-tooth wave shape, a comb-tooth shape, and an L shape. When the condition C2 is satisfied, the first gap is, for example, a linear gap.

Figure 4A:
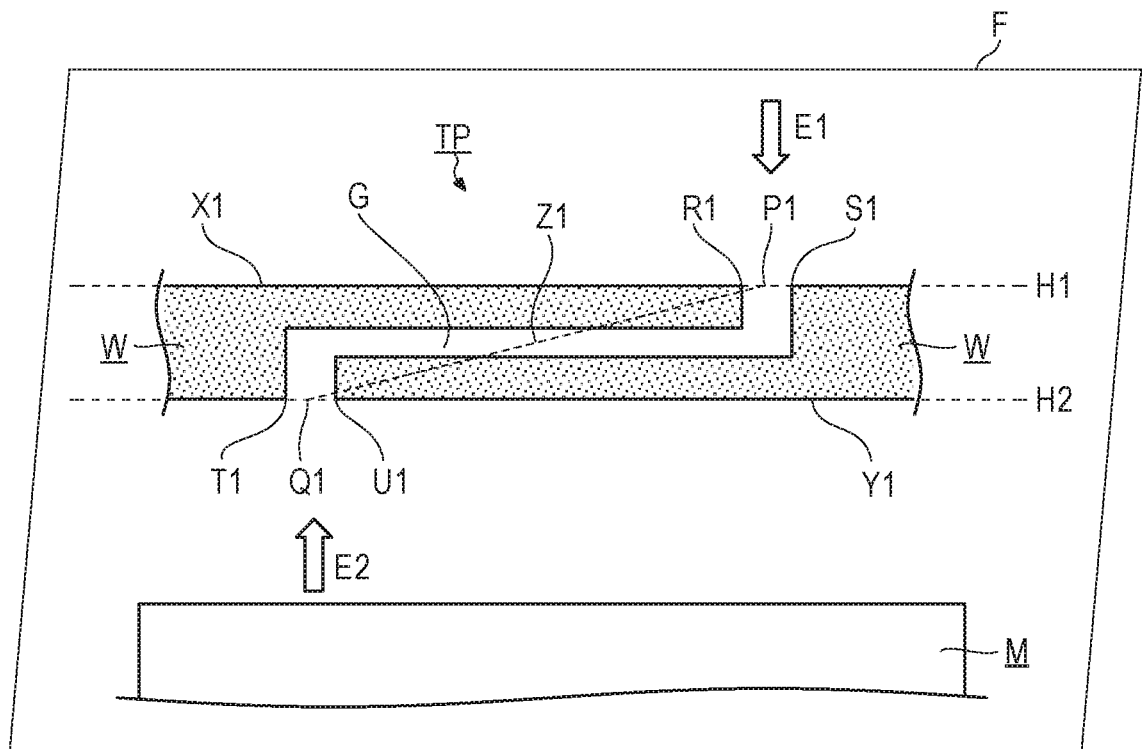
FIG. 4A shows an example of an embodiment.
Figure 4B:
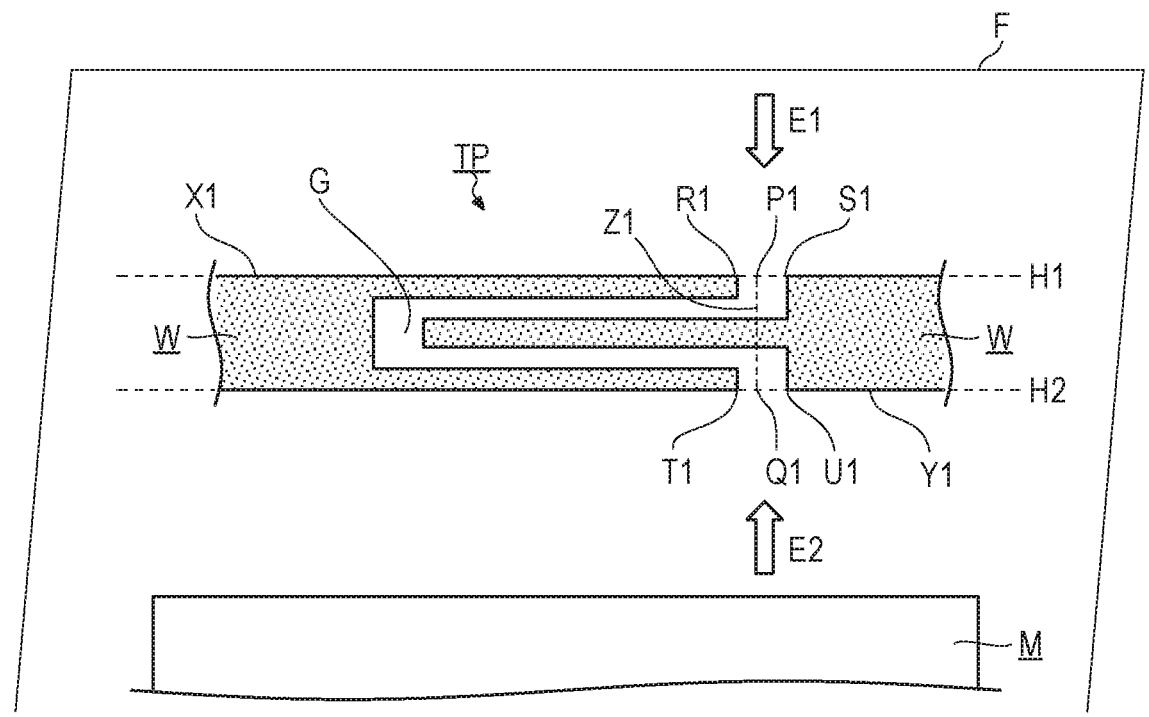
FIG. 4B shows an example of the embodiment.
Figure 4C:
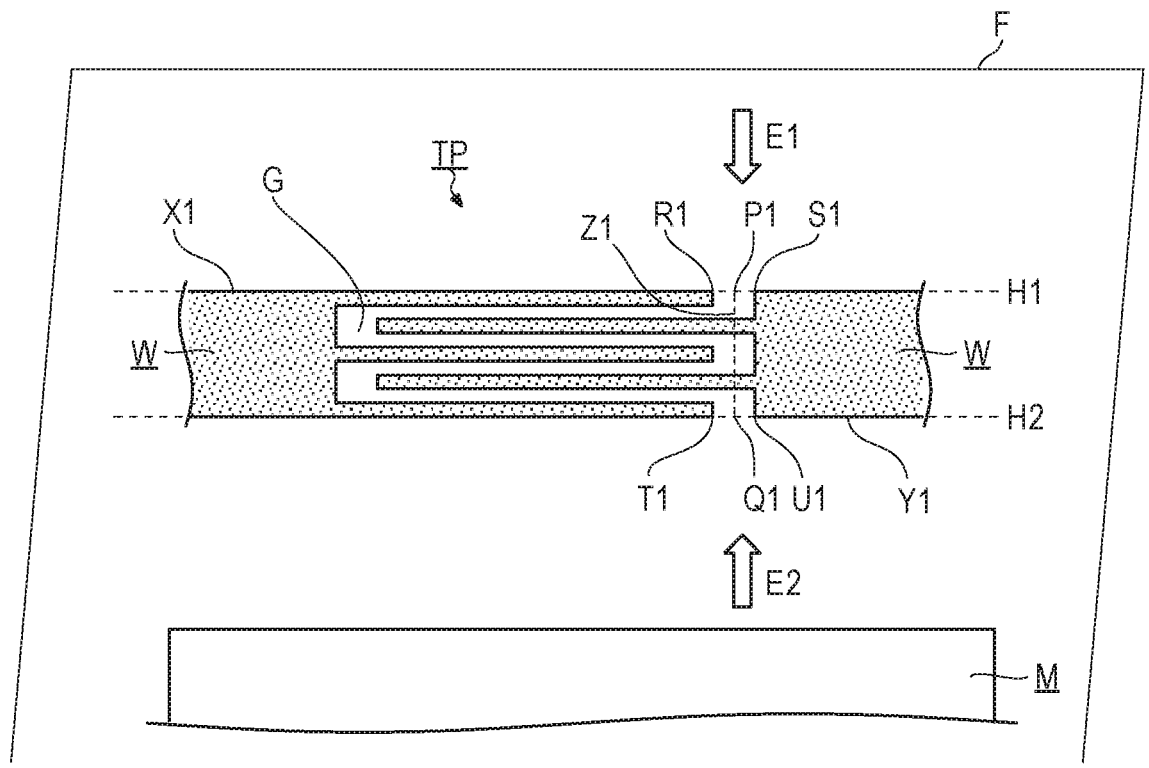
FIG. 4C shows an example of the embodiment.
Figure 4D:
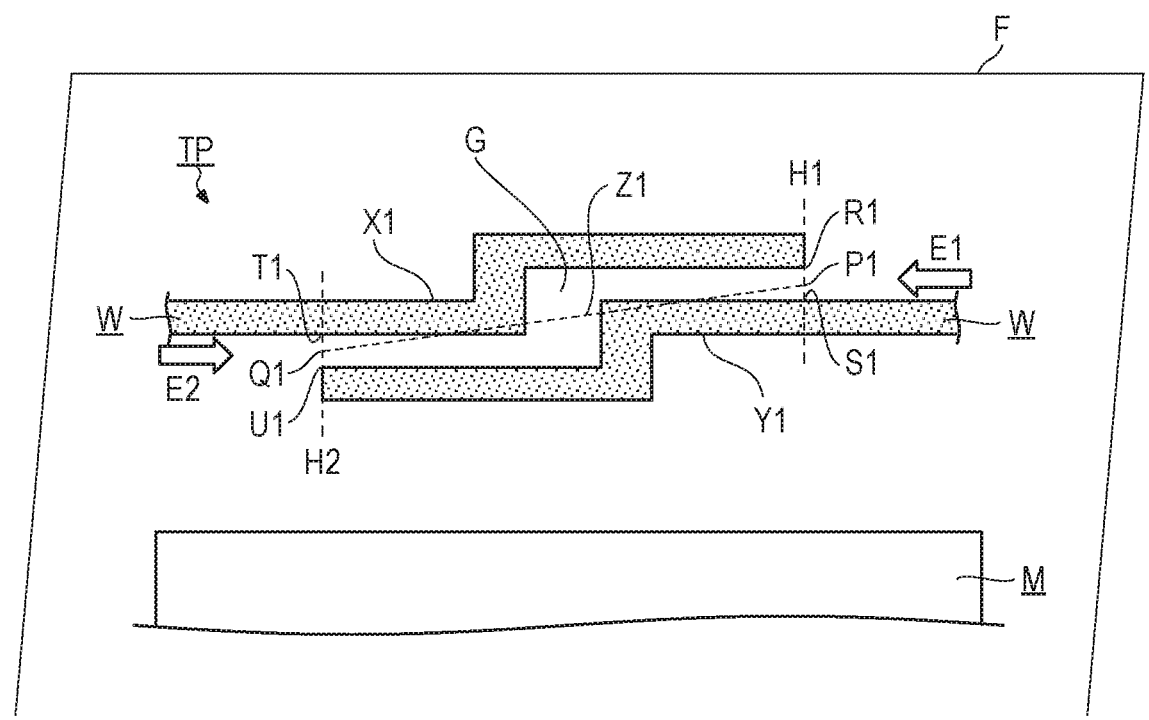
FIG. 4D shows an example of the embodiment.
Figure 4E:
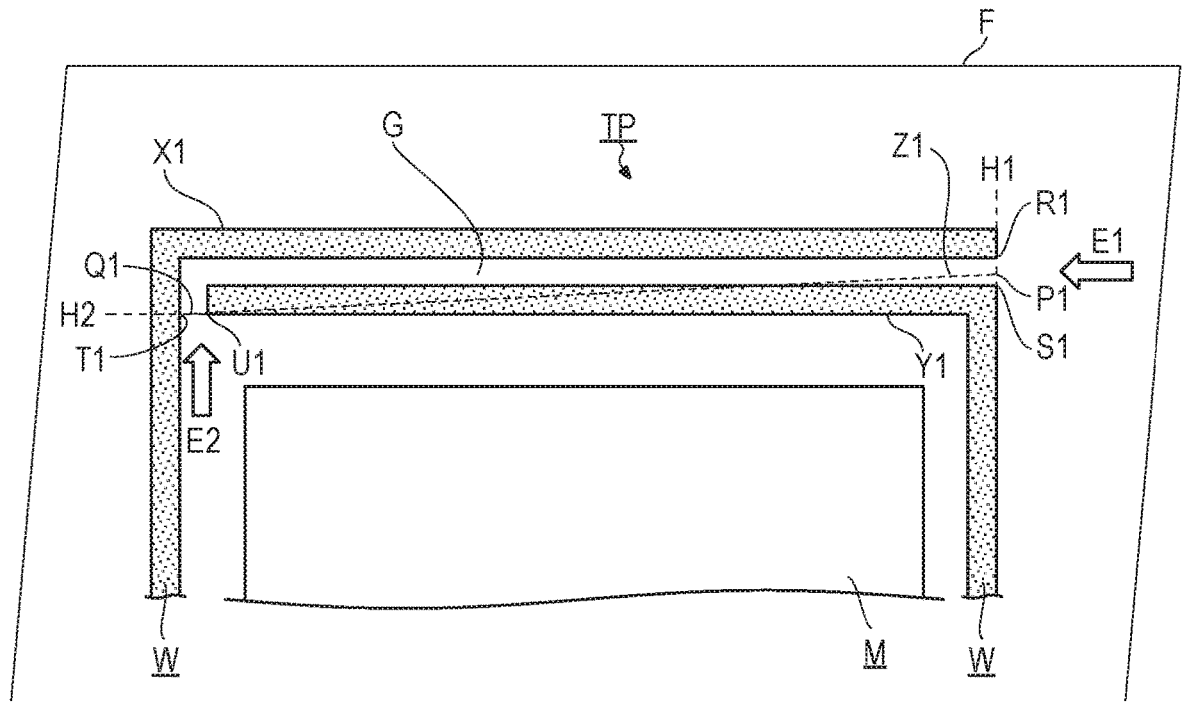
FIG. 4E shows an example of the embodiment.
Figure 4F:
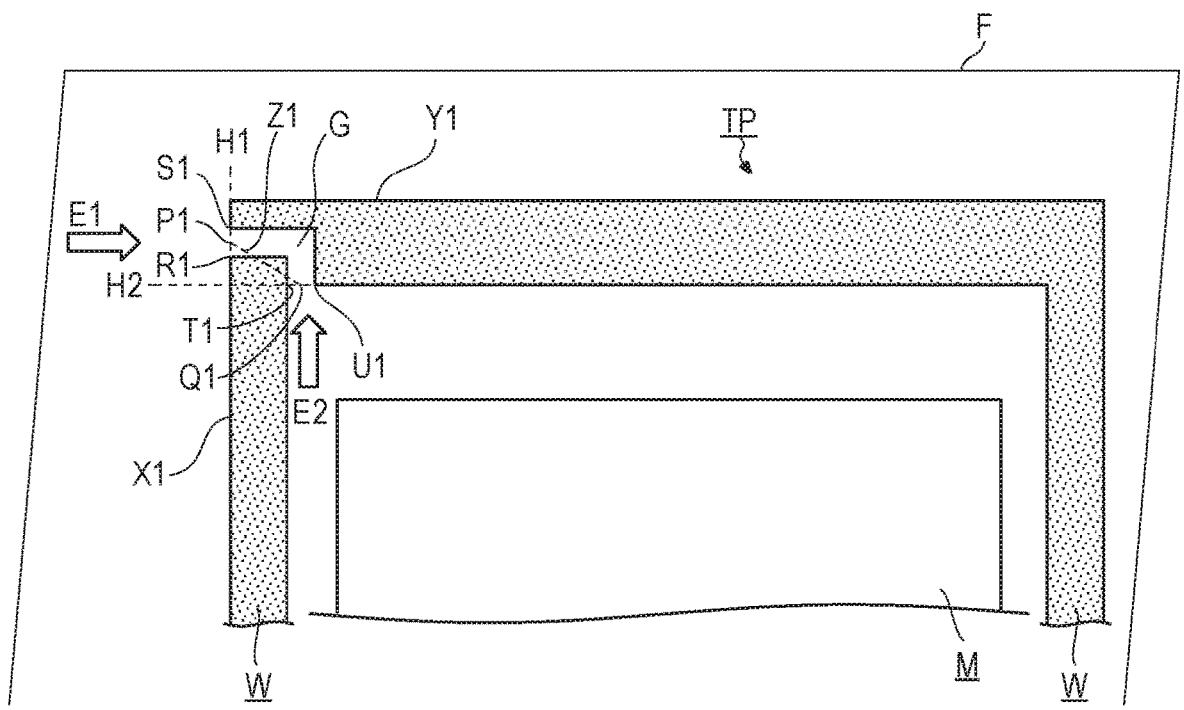
FIG. 4F shows an example of the embodiment.
Figure 4G:
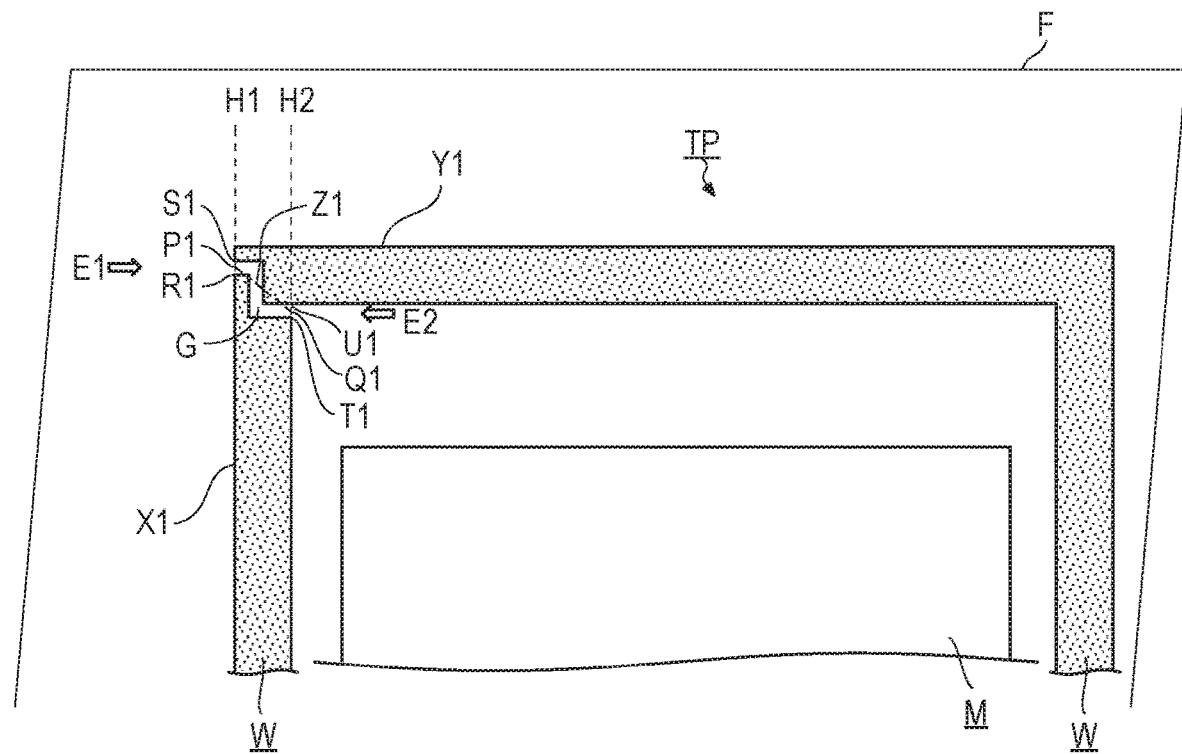
FIG. 4G shows an example of the embodiment.
Figure 4H:
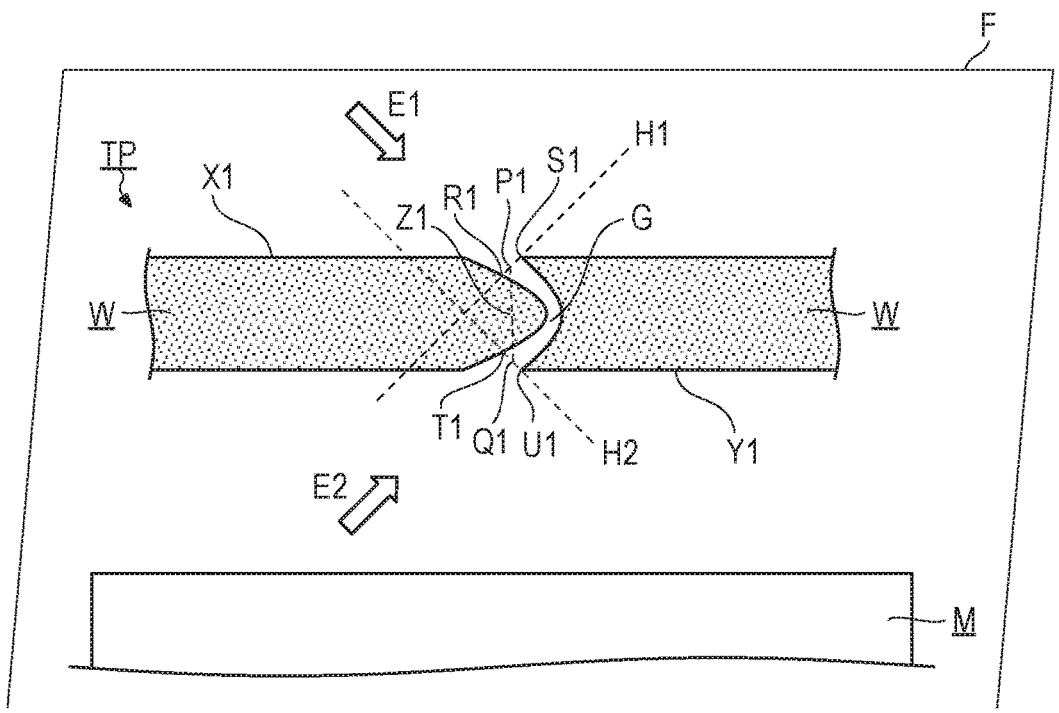
FIG. 4H shows an example of the embodiment.
Figure 4I:
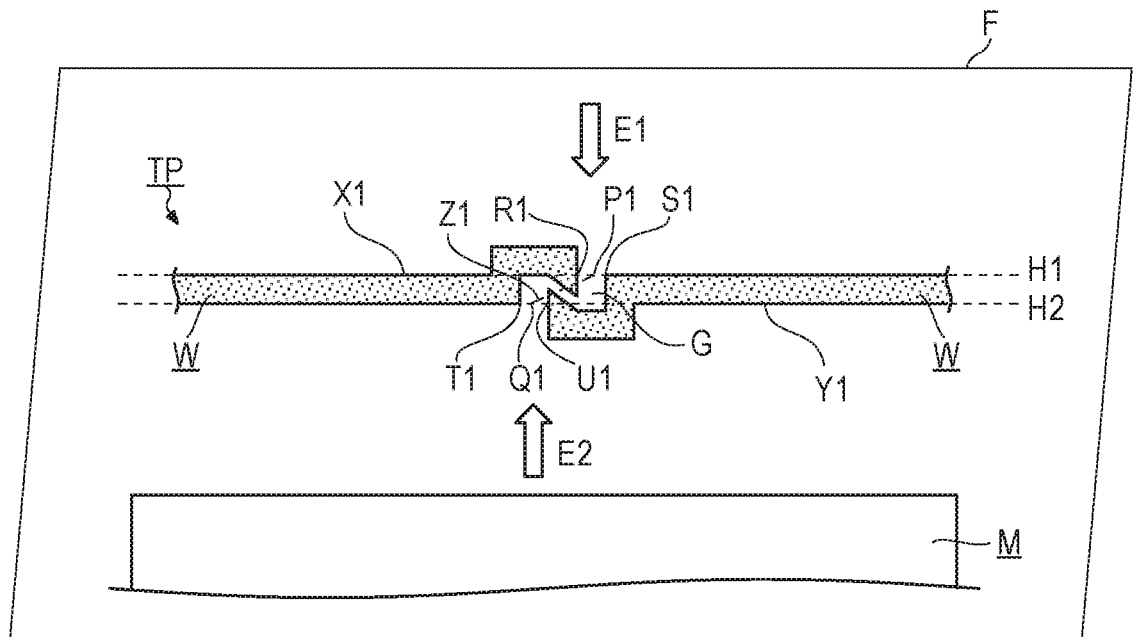
FIG. 4I shows an example of the embodiment.
Figure 4J:
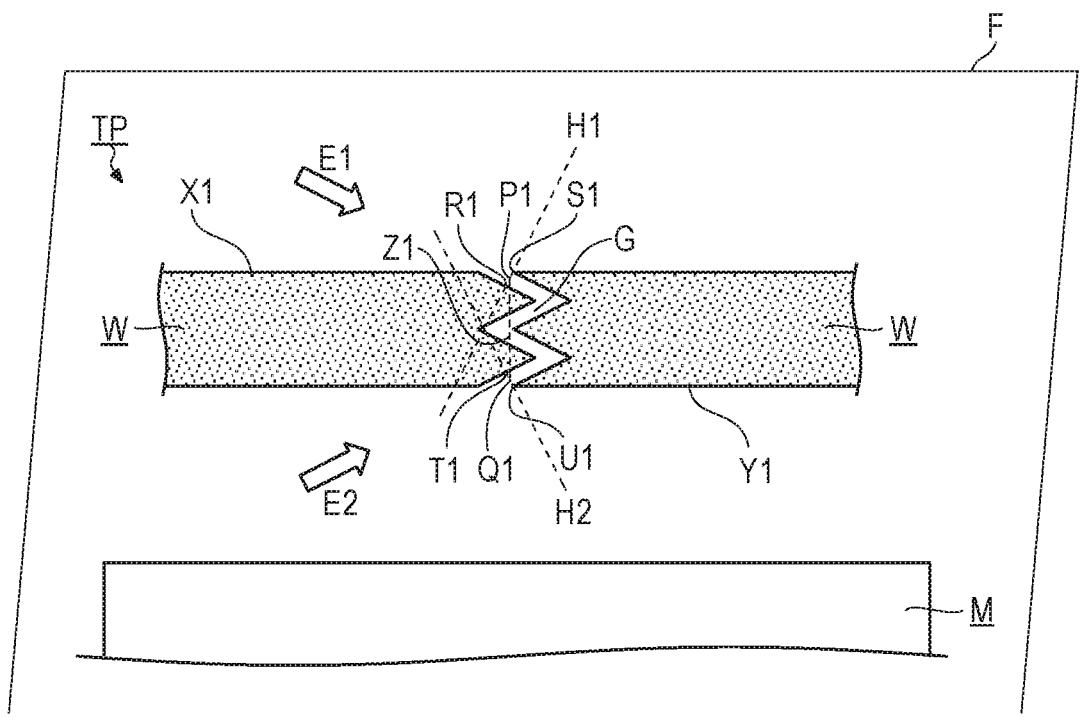
FIG. 4J shows an example of the embodiment.
Figure 4K:
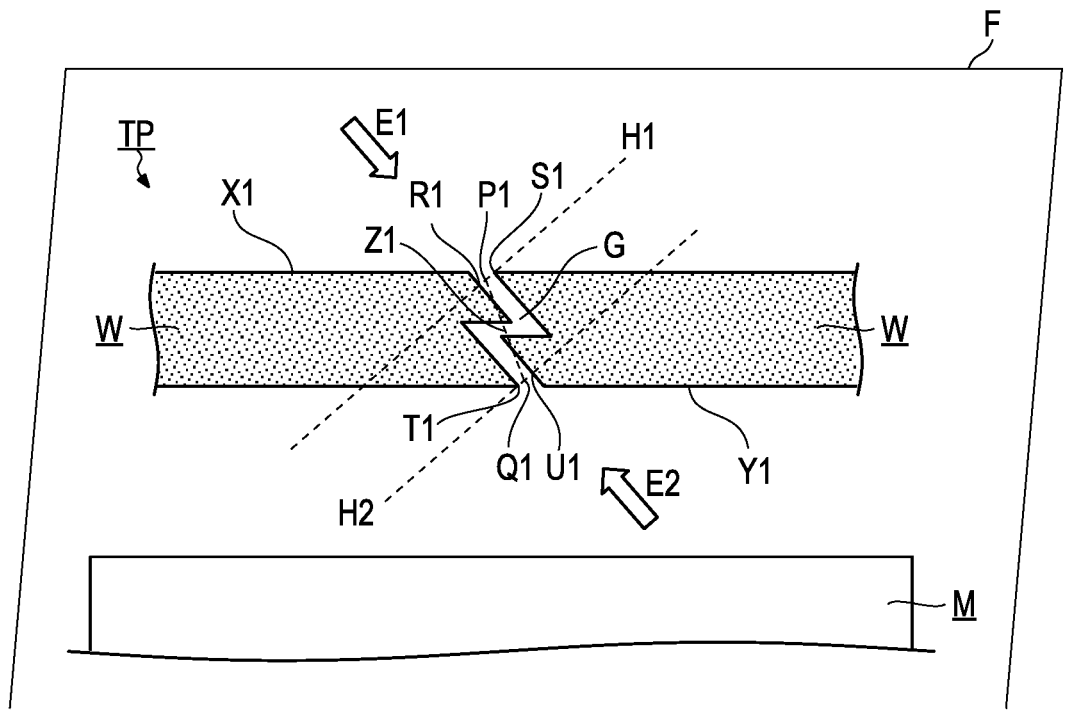
FIG. 4K shows an example of the embodiment.
Figure 4L:
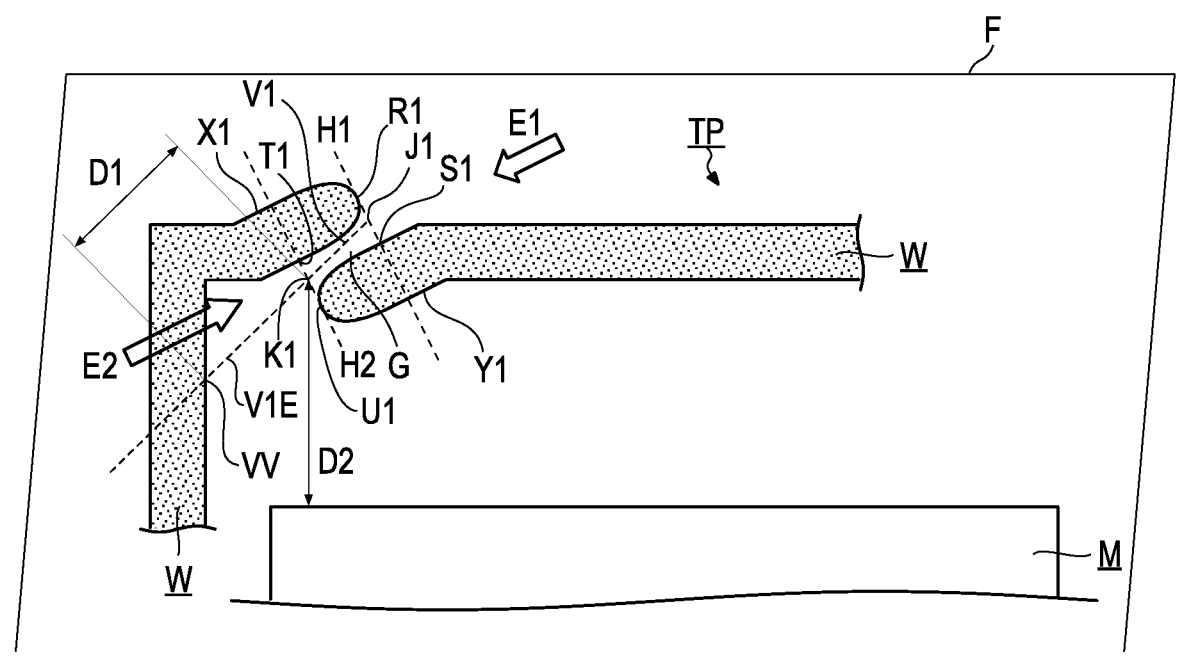
FIG. 4L shows an example of the embodiment.
Figure 4M:
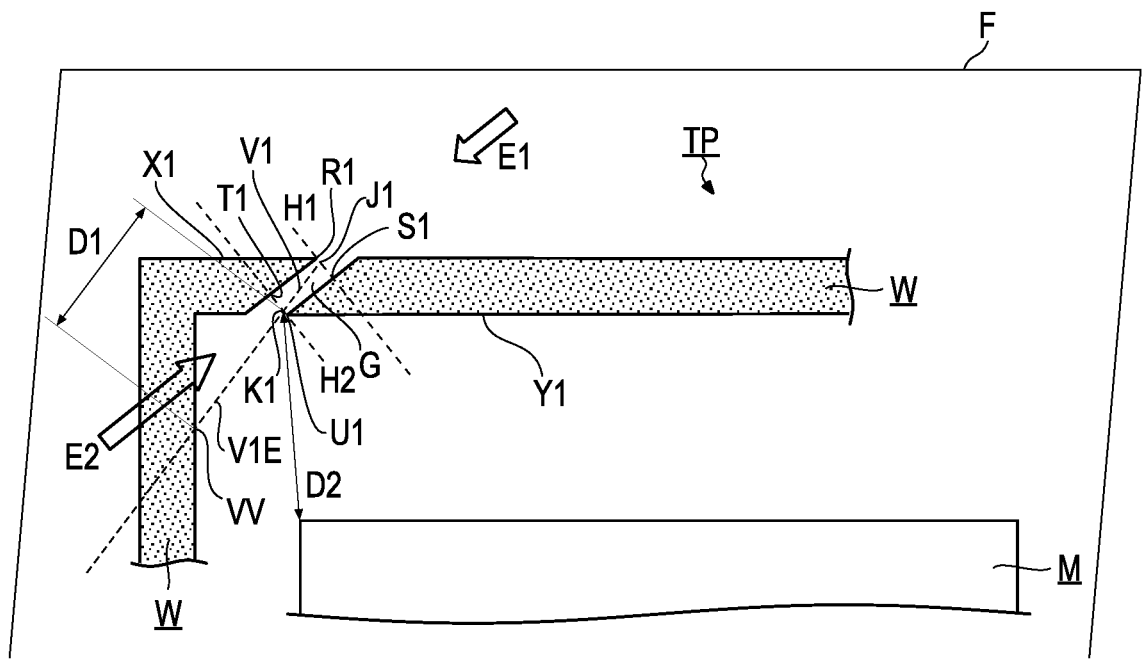
FIG. 4M shows an example of the embodiment.
Figure 4N:
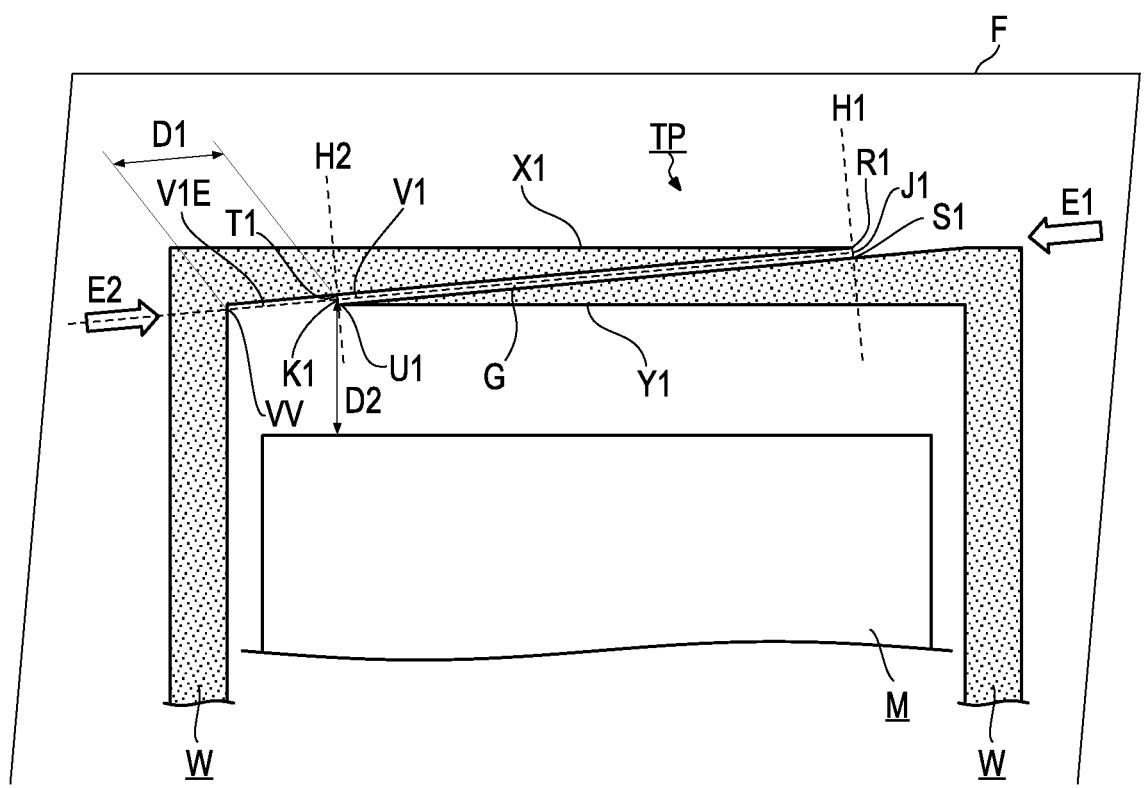
FIG. 4N shows an example of the embodiment.

FIGS. 4A to 4N show specific examples of the embodiment. In each of FIGS. 4A to 4N, only the first gap G and its surroundings are shown. FIGS. 4A to 4K show the embodiment when the condition C1 is satisfied. Although one line segment Z1 is drawn in each of FIGS. 4A to 4K for convenience sake, it is to be understood from FIGS. 4A to 4K that the line segment Z1 connecting "any one point" P1 on the first line segment and "any one point" Q1 on the second line segment intersects at least one of the two first ground wires W. FIGS. 4L to 4N show the embodiment when the condition C2 is satisfied. Although one line segment V1 and one extension V1E are drawn in each of FIGS. 4L to 4N for convenience sake, it is to be understood from FIGS. 4L to 4N that the extension V1E of the line segment V1 that is "any one line segment" satisfying the condition C2p intersects either one of the two first ground wires W without intersecting the first sensor circuit part M.

As to appellative, the term "first ground wires W" according to the embodiment can be rephrased as the "first ground wires 51a and 51b" referred to in the touch panel 100 (that is, the first ground wire W on the left side is rephrased as the first ground wire 51a while the first ground wire W on the right side is rephrased as the first ground wire 51b, in each of FIGS. 4A to 4N). Similarly, the term "first gap G" according to the embodiment can be rephrased as the "first gap 53" referred to in the touch panel 100. Similarly, the term "first sensor circuit part M" according to the embodiment can be rephrased as the "first sensor circuit part 101" referred to in the touch panel 100.

A number N1 which is the number of first ground wires W included in the touch panel TP satisfies N1≥2, and N1=2 preferably holds. When N1≥3, the condition C1 or C2 holds for the first gap G between each adjacent two first ground wires W.

As described above, the touch panel TP includes a second sensor circuit part 102. The touch panel TP can adopt a configuration in which the second sensor circuit part 102 is formed at a first conductor layer 12. Since a configuration in which the first sensor circuit part 101 and the second sensor circuit part 102 are formed at the same conductor layer is well known, a description of the configuration will be omitted. When the second sensor circuit part 102 is formed at the first conductor layer 12, a second ground wire is unnecessary. However, when the second sensor circuit part 102 is formed at a second conductor layer 14, a second ground wire is generally necessary. When the touch panel TP includes two second ground wires, the condition C1 or C2 holds for a second gap between the two second ground wires.

When the touch panel TP includes two second ground wires, as to appellative, the term "first ground wires W" according to the embodiment can be rephrased as the "second ground wires 52a and 52b" referred to in the touch panel 100 (that is, the first ground wire W on the left side is rephrased as the second ground wire 52a while the first ground wire W on the right side is rephrased as the second ground wire 52b, in each of FIGS. 4A to 4N), Similarly, the term "first gap G" according to the embodiment can be rephrased as the "second gap 54" referred to in the touch panel 100. Similarly, the term "first sensor circuit part M" according to the embodiment can be rephrased as the "second sensor circuit part 102" referred to in the touch panel 100.

A number N2 which is the number of second ground wires included in the touch panel TP satisfies N2≥2, and N2=2 preferably holds. When N2≥3, the condition C1 or C2 holds for the second gap between each adjacent two second ground wires.

When the second ground wires are formed at the second conductor layer 14 that is different from the first conductor layer 12 in the touch panel TP, the first gap may be different in shape from the second gap. For example, the first gap can have a configuration shown in FIG. 4A, and the second gap can have a configuration shown in FIG. 4K.

In the touch panel TP, the second ground wires are not always formed at the second conductor layer 14. For example, the whole of each second ground wire may lie on the first ground wire. When the touch panel TP includes two first ground wires and two second ground wires, the whole of the second ground wire on the left side lies on the first ground wire on the left side, and the whole of the second ground wire on the right side lies on the first ground wire on the right side. When the touch panel TP is viewed from front, the second gap overlaps with the first gap (for example, the first gap is included in the second gap when the touch panel TP is viewed from front). This suppresses an antenna effect.

The descriptions below are auxiliary descriptions of parts of the above-described embodiment.

First Example

A touch panel 300 according to a first example has the same configuration as the prior art touch panel 100, except that the touch panel 300 includes two first ground wires 71 and 72 instead of the two first ground wires 51a and 51b and includes two second ground wires 81 and 82 instead of the two second ground wires 52a and 52b. Differences between the two touch panels will be described here. As for technical matters common to the two touch panels, the above description of the touch panel 100 is incorporated herein, and a redundant description of the common matters will be omitted.

A structure of the touch panel 300 will be described below. For simplicity of description, "one of the two first ground wires 71 and 72" may also be simply referred to as "the first ground wire 71", and "the other of the two first ground wires 71 and 72" may also be simply referred to as "the first ground wire 72". Similarly, "one of the two second ground wires 81 and 82" may also be simply referred to as "the second ground wire 81", and "the other of the two second ground wires 81 and 82" may also be referred to as "the second ground wire 82".

Figure 5B:
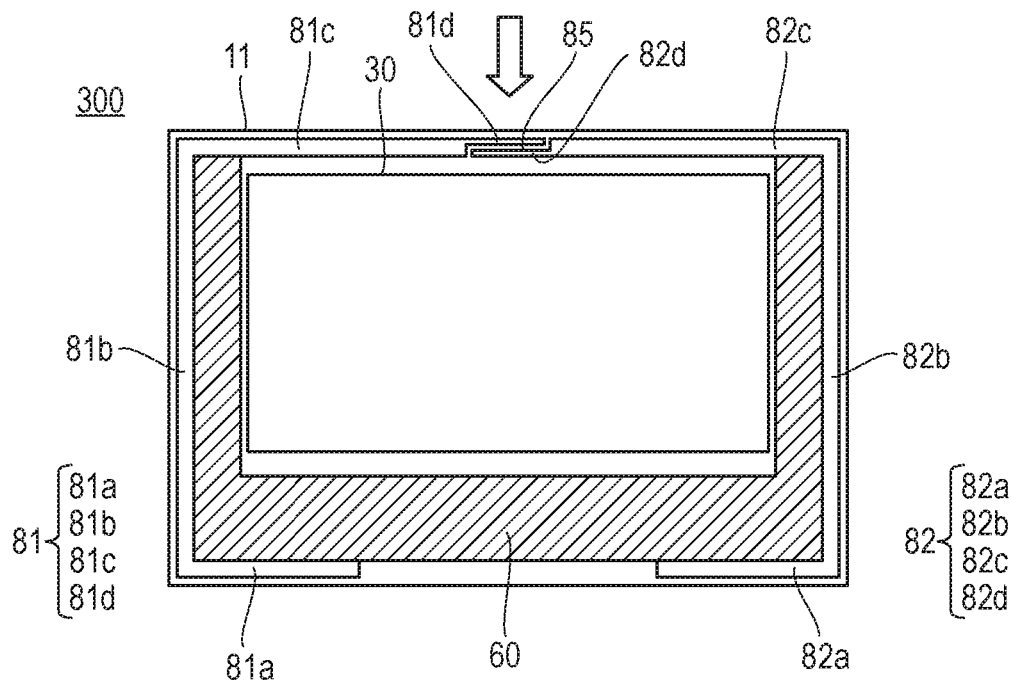
FIG. 5B is a plan view showing an outline of a second conductor layer according to the first example.
Figure 5A:
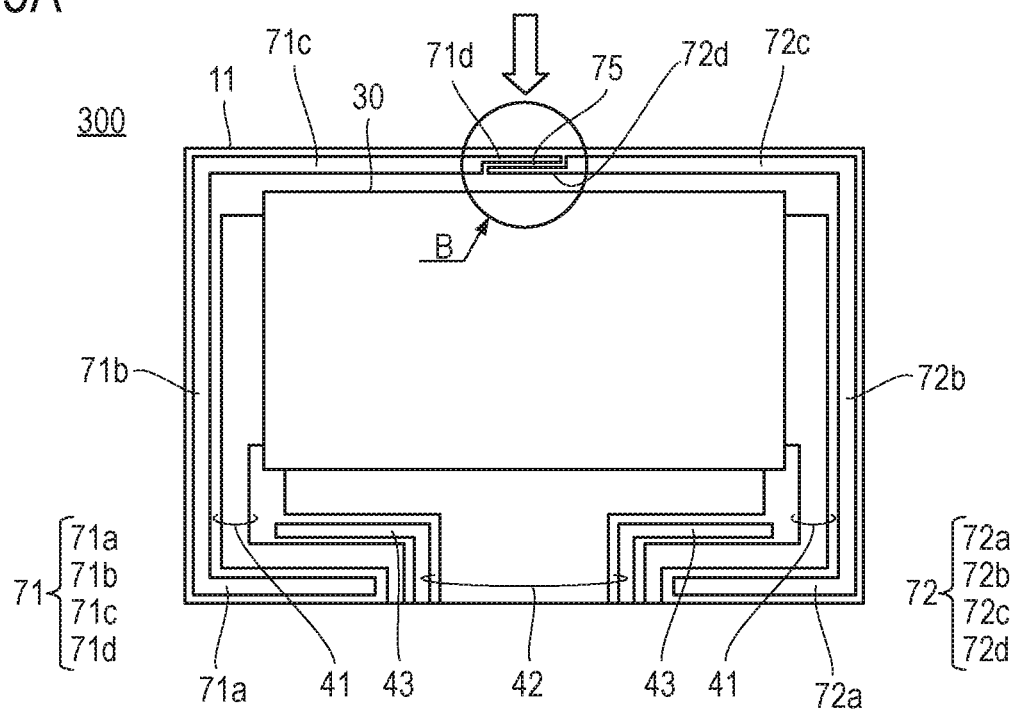
FIG. 5A is a plan view showing an outline of a first conductor layer according to a first example.

FIG. 5A shows a configuration of a first conductor layer in the touch panel 300, and FIG. 5B shows a configuration of a second conductor layer in the touch panel 300.

<Second Ground Wires 81 and 82—FIG. 5B>

When the touch panel 300 is viewed from front (that is, when the touch panel 300 is viewed in a normal direction of a cover 17), the two second ground wires 81 and 82 that each have a strip-like shape which is bent at two spots (that is, the shape of a staple) are located in a peripheral portion of the touch panel 300 and are across a sensor region 30, where the second sensor electrode columns 25 are located, from each other with a large gap between the second ground wires 81 and 82 and the sensor region 30.

The second ground wire 81 includes a first wire portion 81a which extends along one long side (a lower side) of the touch panel 300, a second wire portion 81b which extends along one short side (a left side) of the touch panel 300, a third wire portion 81c which extends along the other long side (an upper side) of the touch panel 300, and a fourth wire portion 81d which is connected to the third wire portion 81c. Similarly, the second ground wire 82 includes a first wire portion 82a which extends along the one long side (lower side) of the touch panel 300, a second wire portion 82b which extends along the other short side (a right side) of the touch panel 300, a third wire portion 82c which extends along the other long side (upper side) of the touch panel 300, and a fourth wire portion 82d which is connected to the third wire portion 82c. The second ground wire 81 is connected to a shielding wire 60 at the first wire portion 81a, the second wire portion 81b, and the third wire portion 81c, The second ground wire 82 is connected to the shielding wire 60 at the first wire portion 82a, the second wire portion 82b, and the third wire portion 82c.

The fourth wire portion 81d is located at one end of the second ground wire 81 and includes one linear conductor which is narrower in width than the third wire portion 81c. Similarly, the fourth wire portion 82d is located at one end of the second ground wire 82 and includes one linear conductor which is narrower in width than the third wire portion 82c. The two fourth wire portions 81d and 82d are arranged parallel to each other with a gap 85 therebetween at a central portion of the upper side of the touch panel 300. When the long sides of the touch panel 300 are viewed from side (that is, when the touch panel 300 is viewed in a direction of an arrow in FIG. 5B), the two fourth wire portions 81d and 82d overlap with each other. In other words, at the central portion of the upper side of the touch panel 300, the fourth wire portion 81d that is one end of the second ground wire 81 and the fourth wire portion 82d that is one end of the second ground wire 82 face each other mainly in a direction orthogonal to an extension direction of the third wire portions 81c and 82c with a gap 85 therebetween.

<First Ground Wires 71 and 72—FIG. 5A>

When the touch panel 300 is viewed from front, the two first ground wires 1 and 72 that each have the shape of a staple are located in the peripheral portion of the touch panel 300 and are across the sensor region 30, where the first sensor electrode rows 21 are located, from each other with a large gap between the first ground wires 71 and 72 and the sensor region 30. The first ground wires 71 and 72 are located immediately below the second ground wires 81 and 82 in a state where an insulating layer 13 intervenes between the first ground wires 71 and 72 and the second ground wires 81 and 82. The first ground wires 71 and 72 have the same configurations as the second ground wires 81 and 82, respectively.

The first ground wire 71 includes a first wire portion 71a which extends along the one long side (lower side) of the touch panel 300, a second wire portion 71b which extends along the one short side (left side) of the touch panel 300, a third wire portion 71c which extends along the other long side (upper side) of the touch panel 300, and a fourth wire portion 71d which is connected to the third wire portion 71c. Similarly, the first ground wire 72 includes a first wire portion 72a which extends along the one long side (lower side) of the touch panel 300, a second wire portion 72b which extends along the other short side (right side) of the touch panel 300, a third wire portion 72c which extends along the other long side (upper side) of the touch panel 300, and a fourth wire portion 72d which is connected to the third wire portion 72c.

Figure 6A:
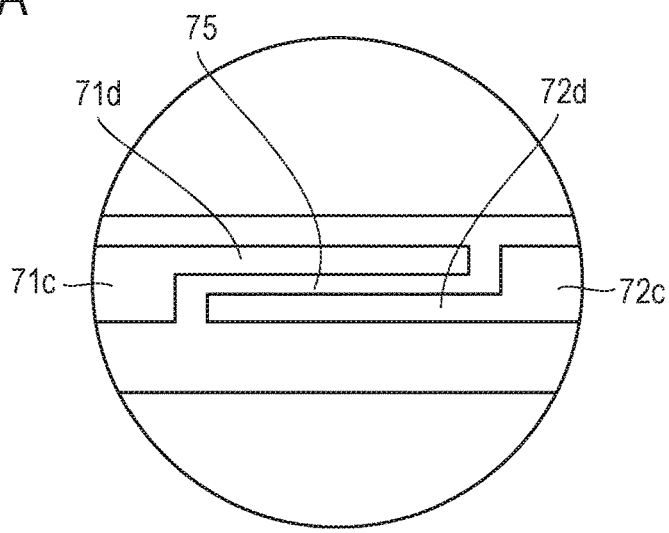
FIG. 6A is an enlarged view of a portion B in FIG. 5A.

The fourth wire portion 71d is located at one end of the first ground wire 71 and includes one linear conductor which is narrower in width than the third wire portion 71c. Similarly, the fourth wire portion 72d is located at one end of the first ground wire 72 and includes one linear conductor which is narrower in width than the third wire portion 72c. The two fourth wire portions 71d and 72d are arranged parallel to each other with a gap 75 therebetween at the central portion of the upper side of the touch panel 300. When the long sides of the touch panel 300 are viewed from side (that is, when the touch panel 300 is viewed in a direction of an arrow in FIG. 5A), the two fourth wire portions 71d and 72d overlap with each other. In other words, at the central portion of the upper side of the touch panel 300, the fourth wire portion 71d that is one end of the first ground wire 71 and the fourth wire portion 72d that is one end of the first ground wire 72 face each other mainly in a direction orthogonal to an extension direction of the third wire portions 71c and 72c with the gap 75 therebetween (see FIG. 6A).

In the touch panel 300, a line of electric force extending from outside the touch panel 300 into the touch panel 300 intersects the fourth wire portions 71d, 72d, 81d, and 82d at overlapping portions, and charges are trapped in the first and second ground wires 71, 72, 81, and 82. Thus, the touch panel 300 can prevent static electricity from invading the touch panel 300 from a direction parallel to a surface of a transparent substrate 11, and the touch panel 300 is higher in resistance to static electricity than the conventional touch panel 100. This allows avoidance of occurrence of a major failure, typified by melting and breaking or breakage of a sensor electrode or the like, due to static electricity.

Figure 6B:
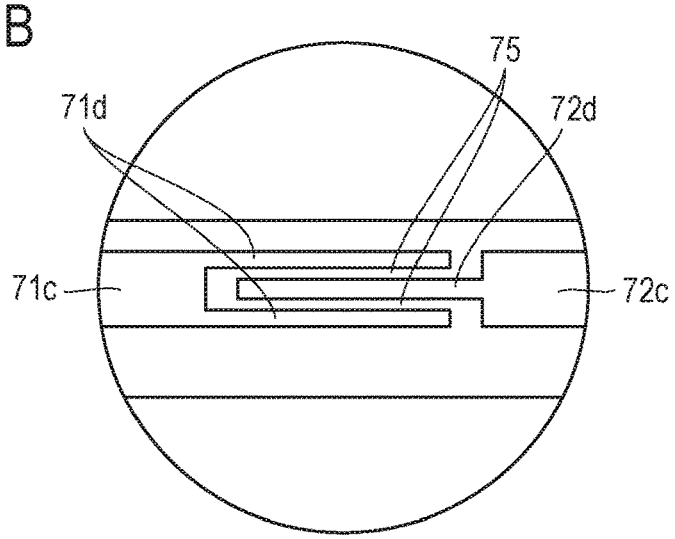
FIG. 6B is a view showing a modification of the portion B in FIG. 5A.
Figure 6C:
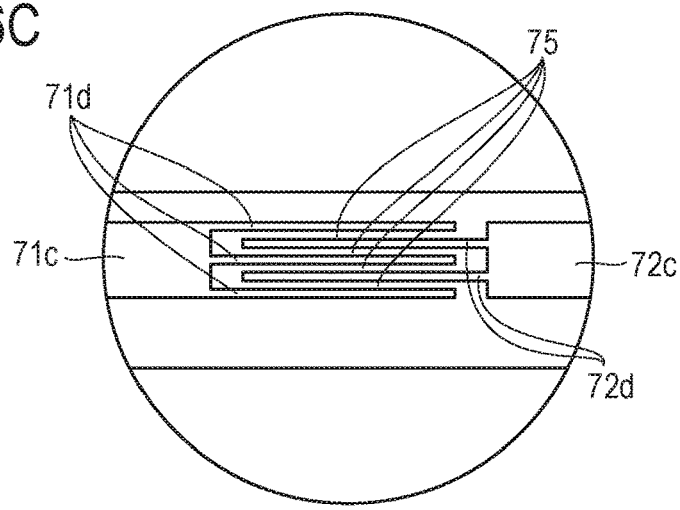
FIG. 6C is a view showing a modification of the portion B in FIG. 5A.

FIGS. 6B and 6C show comb-like configurations as modifications of a portion B shown in FIG. 5A.

In the comb-like configuration shown in FIG. 6B, the fourth wire portion 71d includes two linear conductors narrower in width than the third wire portion 71c, and the fourth wire portion 72d includes one linear conductor narrower in width than the third wire portion. The two linear conductors of the fourth wire portion 71d and the one linear conductor of the fourth wire portion 72d are arranged in a staggered configuration. Although not shown, a configuration may be similarly adopted in which the fourth wire portion 81d includes two linear conductors narrower in width than the third wire portion 81c, the fourth wire portion 82d includes one linear conductor narrower in width than the third wire portion 82c, and the two linear conductors of the fourth wire portion 81d and the one linear conductor of the fourth wire portion 82d are arranged in a staggered configuration.

In the comb-like configuration shown in FIG. 6C, the fourth wire portion 71d includes three linear conductors narrower in width than the third wire portion 71c, and the fourth wire portion 72d includes two linear conductors narrower in width than the third wire portion 72c. The three linear conductors of the fourth wire portion 71d and the two linear conductors of the fourth wire portion 72d are arranged in a staggered configuration.

Although not shown, a configuration may be similarly adopted in which the fourth wire portion 81d includes three linear conductors narrower in width than the third wire portion 81c, the fourth wire portion 82d includes two linear conductors narrower in width than the third wire portion 82c, and the three linear conductors of the fourth wire portion 81d and the two linear conductors of the fourth wire portion 82d are arranged in a staggered configuration.

Second Example

A touch panel 400 according to a second example has the same configuration as the prior art touch panel 100, except that the touch panel 400 includes first ground wires 73 and 74 instead of the first ground wires 51a and 51b and includes second ground wires 83 and 84 instead of the second ground wires 52a and 52b. Differences between the two touch panels will be described here. As for technical matters common to the two touch panels, the above description of the touch panel 100 is incorporated herein, and a redundant description of the common matters will be omitted.

A structure of the touch panel 400 will be described below. For simplicity of description, "one of the two first ground wires 73 and 74" may also be simply referred to as "the first ground wire 73", and "the other of the two first ground wires 73 and 74" may also be simply referred to as "the first ground wire 74". Similarly, "one of the two second ground wires 83 and 84" may also be simply referred to as "the second ground wire 83", and "the other of the two second ground wires 83 and 84" may also be simply referred to as "the second ground wire 84".

Figure 7B:
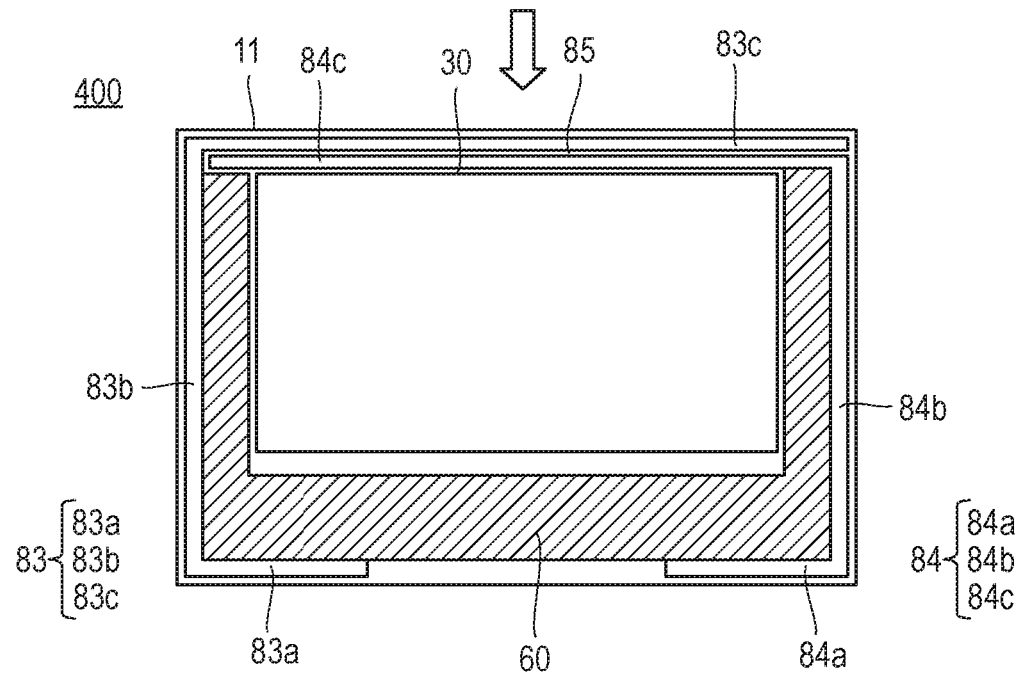
FIG. 7B is a plan view showing an outline of a second conductor layer according to the second example.
Figure 7A:
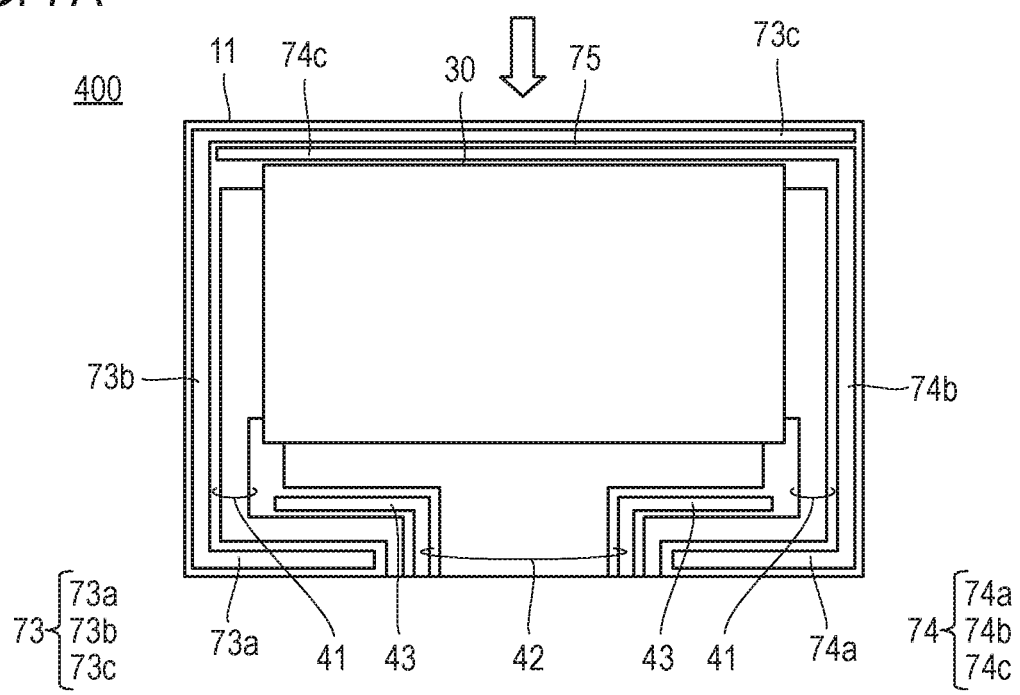
FIG. 7A is a plan view showing an outline of a first conductor layer according to a second example.

FIG. 7A shows a configuration of a first conductor layer in the touch panel 400, and FIG. 7B shows a configuration of a second conductor layer in the touch panel 400.

<Second Ground Wires 83 and 84>

When the touch panel 400 is viewed from front, the two second ground wires 83 and 84 that each have the shape of a staple are located in a peripheral portion of the touch panel 400 and are across a sensor region 30, where the second sensor electrode columns 25 are located, from each other with a large gap between the second ground wires 83 and 84 and the sensor region 30.

The second ground wire 83 includes a first wire portion 83a which extends along one long side (a lower side) of the touch panel 400, a second wire portion 83b which extends along one short side (a left side) of the touch panel 400, and a third wire portion 83c which extends along the other long side (an upper side) of the touch panel 400. Similarly, the second ground wire 84 includes a first wire portion 84a which extends along the one long side (lower side) of the touch panel 400, a second wire portion 84b which extends along the other short side (a right side) of the touch panel 400, and a third wire portion 84c which extends along the other long side (upper side) of the touch panel 400.

The third wire portion 83c is located on one end side of the second ground wire 83 and has a length slightly shorter than an entire length of the upper side of the touch panel 400. Similarly, the third wire portion 84c is located on one end side of the second ground wire 84 and has a length slightly shorter than the entire length of the upper side of the touch panel 400. The two third wire portions 83c and 84c are arranged parallel to each other at the upper side of the touch panel 400. When the long sides of the touch panel 400 are viewed from side (that is, when the touch panel 400 is viewed in a direction of an arrow in FIG. 7B), the two third wire portions 83c and 84c overlap with each other over an entire length of the third wire portion 84c. In other words, at the upper side of the touch panel 400, the third wire portion 83c located on the one end side of the second ground wire 83 and the third wire portion 84c located on the one end side of the second ground wire 84 face each other mainly in a direction orthogonal to an extension direction of the third wire portions 83c and 84c with a gap 85 therebetween. One end of the second ground wire 84 (that is, an end portion of the third wire portion 84c) and a shielding wire 60 are insulated from each other with a gap therebetween.

<First Ground Wires 73 and 74>

When the touch panel 400 is viewed from front, the two first ground wires 73 and 74 that each have the shape of a staple are located in the peripheral portion of the touch panel 400 and are across the sensor region 30, where a plurality of first sensor electrode rows 21 are located, from each other with a large gap between the first ground wires 73 and 74 and the sensor region 30. The first ground wires 73 and 74 are located immediately below the second ground wires 83 and 84 in a state where an insulating layer 13 intervenes between the first ground wires 73 and 74 and the second ground wires 83 and 84. The first ground wires 73 and 74 have the same configurations as the second ground wires 83 and 84.

The first ground wire 73 includes a first wire portion 73a which extends along the one long side (lower side) of the touch panel 400, a second wire portion 73b which extends along the one short side (left side) of the touch panel 400, and a third wire portion 73c which extends along the other long side (upper side) of the touch panel 400. Similarly, the first ground wire 74 includes a first wire portion 74a which extends along the one long side (lower side) of the touch panel 400, a second wire portion 74b which extends along the other short side (right side) of the touch panel 400, and a third wire portion 74c which extends along the other long side (upper side) of the touch panel 400.

The third wire portion 73c is located on one end side of the first ground wire 73 and has a length slightly shorter than the entire length of the upper side of the touch panel 400. Similarly, the third wire portion 74c is located on one end side of the first ground wire 74 and has a length slightly shorter than the entire length of the upper side of the touch panel 400. The two third wire portions 73c and 74c are arranged parallel to each other at the upper side of the touch panel 400. When the long sides of the touch panel 400 are viewed from side (that is, when the touch panel 400 is viewed in a direction of an arrow in FIG. 7A), the two third wire portions 73c and 74c overlap with each other over an entire length of the third wire portion 74c. In other words, at the upper side of the touch panel 400, the third wire portion 73c located on the one end side of the first around wire 73 and the third wire portion 74c located on the one end side of the first ground wire 74 face each other mainly in a direction orthogonal to an extension direction of the third wire portions 73c and 74c with a gap 75 therebetween.

Third Example

A touch panel 500 according to a third example has the same configuration as the prior art touch panel 100, except for inclusion of ground wires 71, 72, 81, and 82 described in the first example instead of the ground wires 51a, 51b, 52a, and 52b and a layer structure of the ground wires 71, 72, 81, and 82. Differences between two touch panels will be described here. As for technical matters common to the two touch panels, the above description of the touch panel 100 is incorporated herein, and a redundant description of the common matters will be omitted.

Figure 8A:
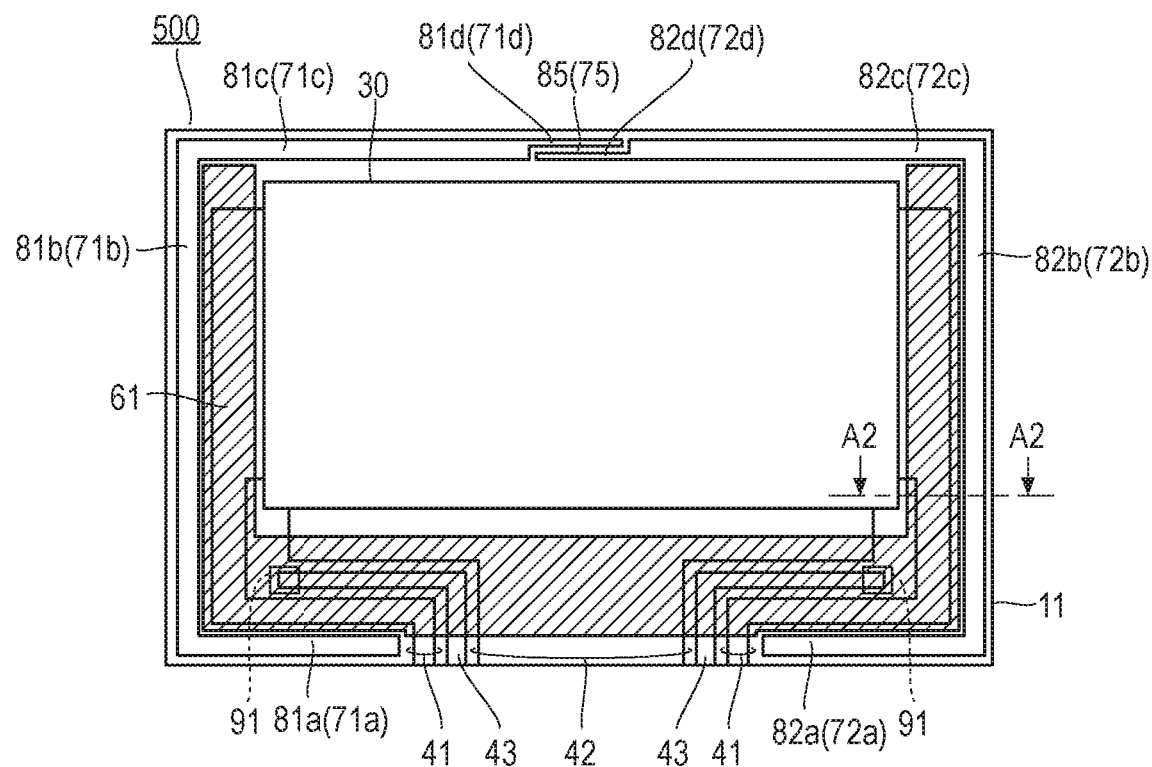
FIG. 8A is a plan view showing an outline of a third example.
Figure 8B:
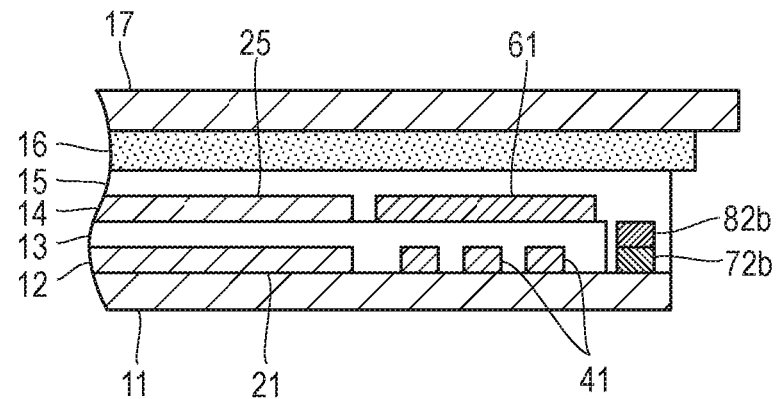
FIG. 8B is a view for explaining a cross-section configuration (A2-A2) of a touch panel shown in FIG. 8A.

FIG. 5A shows a plan view of the touch panel 500, and FIG. 8B shows a layer structure of the touch panel 500.

The first ground wires 71 and 72 are not covered with an insulating layer 13. As shown in FIGS. 8A and 8B, the second ground wire 81 is put directly on the first ground wire 71 while the second ground wire 82 is put directly on the first ground wire 72.

According to the above-described configuration, the first ground wires 71 and the second ground wires 81 are joined with each other and therefore have a large cross-section area as a whole, which allows an increase in allowable current. Similarly, the first ground wires 72 and the second ground wires 82 are joined with each other and therefore have a large cross-section area as a whole, which allows an increase in allowable current. It is thus possible to satisfactorily release invading static electricity to an external circuit board.

In the present example, a shielding wire 61 is insulated from the second ground wires 81 and 82 with a gap between the shielding wire 61 and the second ground wires 81 and 82. The shielding wire 61 is connected to third ground wires 43 through holes 91 which are formed in the insulating layer 13 in the example. FIG. 8B that is a schematic view is drawn such that the second ground wire 82 is not located lateral to the shielding wire 61. A portion of a protective film 15 which is located right on the second ground wire 82 does not actually have a thickness as shown in FIG. 8B (more specifically, the portion of the protective film 15 at the position has almost the same thickness as a portion of the protective film 15 located on the shielding wire 61), and the protective film 15 adheres to an optical clear adhesive 16. Thus, the second ground wire 82 is located almost lateral to the shielding wire 61, and the first ground wire 72 is located almost lateral to a first frame wire 41.

A configuration in which the second ground wires 81 and 82 are, respectively, put directly on the first ground wires 71 and 72 needs to be configured to prevent the ground wires 71, 72, 81, and 82 from producing an antenna effect. Thus, a position of the gap 75 between the two first ground wires 71 and 72 needs to be the same as a position of the gap 85 between the two second ground wires 81 and 82. In a configuration in which the insulating layer 13 intervenes between the first ground wires 71 and 72 and the second ground wires 81 and 82, the position of the gap 75 need not accord with the position of the gap 85.

In each of the above-described touch panels, all lines of electric force extending from outside of a region surrounded by first and second ground wires into the region intersect the first and second ground wires. Thus, charges are trapped in the first and second ground wires to prevent invasion of static electricity into the touch panel.

Additionally, it is also considered as effective to increase an invasion path for static electricity from outside a region surrounded by first and second ground wires into the region as much as possible in order to prevent invasion of static electricity. In this regard, in each of the touch panels, a length over which two ground wires face each other at a portion where a gap intervenes is longer than that of the prior art touch panel 100, the touch panel can satisfactorily prevent invasion of static electricity.

In the specification, the term "connected" and every inflected form thereof mean direct or indirect connection between two or more elements and can embrace presence of one or more intermediate elements between two elements "connected" to each other. Connection between elements may be physical connection, electrical connection, or a combination thereof.

In the specification and the claims, an ordinal numeral is not intended to limit an element modified by or coupled to the ordinal numeral by an ordinal position or the amount of the element regardless of a definition of the ordinal numeral, unless otherwise noted. An ordinal numeral is merely used as a convenient expression method to distinguish two or more elements from one another, unless otherwise noted. Thus, for example, the phrase "the first X" and the phrase "the second X" are expressions to distinguish between the two Xs, do not necessarily mean that the total number of Xs is limited to 2, and do not necessarily means that the first X has to come before the second X. The term "first" does not necessarily mean "corning before all others in order".

In the specification and the claims, the term "include" and "comprise" and inflected forms thereof are used as non-exclusive expressions. For example, the sentence "X includes A and B" does not deny that X includes a component other than A and B (for example, C). If a certain sentence in the specification and the claims includes a phrase in which the term "include" or "comprise" or an inflected form thereof is coupled to a negative word, the sentence only mention an object of the term "include" or "comprise" or the inflected form thereof. Thus, for example, the sentence "X does not include A and B" admits a possibility that X includes a component other than A and B. Additionally, the term "or" used in the specification and the claims is intended to mean an exclusive OR.

The foregoing description of the embodiment of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A touch panel comprising:
   a first sensor circuit part; and
   two first ground wires, each of the two first ground wires having a strip-like shape, wherein
   the first sensor circuit part and the two first ground wires are formed at a same layer,
   the first sensor circuit part is sandwiched between the two first ground wires,
   one end portion of one of the two first ground wires, which is hereinafter referred to as a "first end portion", and one end portion of the other of the two first ground wires, which is hereinafter referred to as a "second end portion", form a first gap,
   when the touch panel is viewed from front, an extension of a first line segment which extends into the touch panel intersects either one of the two first ground wires without intersecting the first sensor circuit part, the first line segment being any one line segment which connects a first point on a second line segment and a second point on a third line segment and not intersecting the two first ground wires, the second line segment connecting a site of the first end portion and a site of the second end portion that are located on two sides of an outer gate of the first gap, the third line segment connecting a site of the first end portion and a site of the second end portion that are located on two sides of an inner gate of the first gap, and
   a maximum value of a first distance is smaller than a minimum value of a second distance, the first distance being a distance between the second point and an intersection of the extension and an inner edge of one of the two first ground wires which intersects the extension, the second distance being a shortest distance from the second point to the first sensor circuit part.

2. The touch panel according to claim 1, wherein the first gap is a linear gap.

3. The touch panel according to claim 2, further comprising:
   a second sensor circuit part; and
   two second ground wires, each of the two second ground wires having a strip-like shape, wherein
   the second sensor circuit part is sandwiched between the two second ground wires,
   the first sensor circuit part and the second sensor circuit part are insulated from each other,
   one end portion of one of the two second ground wires, which is hereinafter referred to as a "third end portion", and one end portion of the other of the two second ground wires, which is hereinafter referred to as a "fourth end portion", form a second gap, and
   when the touch panel is viewed from front, an extension of a fourth line segment which extends into the touch panel intersects either one of the two second ground wires without intersecting the second sensor circuit part, the fourth line segment being any one line segment which connects a third point on a fifth line segment and a fourth point on a sixth line segment and not intersecting the two second ground wires, the fifth line segment connecting a site of the third end portion and a site of the fourth end portion that are located on two sides of an outer gate of the second gap, the sixth line segment connecting a site of the third end portion and a site of the fourth end portion that are located on two sides of an inner gate of the second gap.

4. The touch panel according to claim 3, wherein the two second ground wires lie on the two first ground wires, and when the touch panel is viewed from front, the second gap overlaps with the first gap.

5. The touch panel according to claim 1, further comprising:
a second sensor circuit part; and
two second ground wires, each of the two second ground wires having a strip-like shape, wherein
the second sensor circuit part is sandwiched between the two second ground wires,
the first sensor circuit part and the second sensor circuit part are insulated from each other,
one end portion of one of the two second ground wires, which is hereinafter referred to as a "third end portion", and one end portion of the other of the two second ground wires, which is hereinafter referred to as a "fourth end portion", form a second gap, and
when the touch panel is viewed from front, an extension of a fourth line segment which extends into the touch panel intersects either one of the two second ground wires without intersecting the second sensor circuit part, the fourth line segment being any one line segment which connects a third point on a fifth line segment and a fourth point on a sixth line segment and not intersecting the two second ground wires, the fifth line segment connecting a site of the third end portion and a site of the fourth end portion that are located on two sides of an outer gate of the second gap, the sixth line segment connecting a site of the third end portion and a site of the fourth end portion that are located on two sides of an inner gate of the second gap.

6. The touch panel according to claim 5, wherein
the two second ground wires lie on the two first ground wires, and
when the touch panel is viewed from front, the second gap overlaps with the first gap.

* * * * *

UNITED STATES PATENT AND TRADEMARK OFFICE
CERTIFICATE OF CORRECTION

PATENT NO. : 10,928,951 B2
APPLICATION NO. : 16/412975
DATED : February 23, 2021
INVENTOR(S) : Akitoshi Sakaue et al.

It is certified that error appears in the above-identified patent and that said Letters Patent is hereby corrected as shown below:

In the Specification

Column 1, Line 65, "the first ground wire 51b", Similarly" should read -- the first ground wire 51b". Similarly --.

Column 1, the last line, "the second ground wire 2a", and" should read -- the second ground wire 52a", and --.

Column 3, Line 3, "the second ground wire 52h" should read -- the second ground wire 52b --.

Column 4, Line 15, "51h and the two" should read -- 51b and the two --.

Column 5, Line 53, "the embodiment," should read -- the embodiment. --.

Column 5, Line 60, "the embodiment," should read -- the embodiment. --.

Column 6, Line 2, "the first example," should read -- the first example. --.

Column 6, Line 41, "wires W, Each of" should read -- wires W. Each of --.

Column 6, Line 59, "first gap G" should read -- first gap G. --.

Column 7, Line 5, "the end portion Y the site" should read -- the end portion Y1, the site --.

Column 7, Line 13, "the Outer gate" should read -- the outer gate --.

Column 7, Line 50, "the site U being" should read -- the site U1 being --.

Column 7, Line 59, "the first gap E" should read -- the first gap G --.

Signed and Sealed this
Twenty-ninth Day of June, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,928,951 B2

Column 8, Line 24, "the extension VIE" should read -- the extension V1E --.

Column 9, Line 31, "4N), Similarly" should read -- 4N). Similarly --.

Column 10, Line 49, "portion 81c, The second" should read -- portion 81c. The second --.

Column 11, Line 8, "wires 1 and 72" should read -- wires 71 and 72 --.

Column 12, Line 5, "portion. The two linear" should read -- portion 72c. The two linear --.

Column 14, Line 8, "the first around wire 73" should read -- the first ground wire 73 --.

Column 14, Line 26, "FIG. 5A" should read -- FIG. 8A --.

Column 14, Line 54, "film 15 located on" should read -- film 15 located right on --.

Column 15, Line 37, "mean "corning before" should read -- mean "coming before --.